United States Patent [19]
Stowers et al.

[11] Patent Number: 5,936,421
[45] Date of Patent: Aug. 10, 1999

[54] COAXIAL DOUBLE-HEADED SPRING CONTACT PROBE ASSEMBLY AND COAXIAL SURFACE CONTACT FOR ENGAGEMENT THEREWITH

[75] Inventors: Jeffrey P. Stowers, Mt. Sydney; Henri T. Burgers, Grottoes; Paul D. Blackard, Waynesboro, all of Va.

[73] Assignee: Virginia Panel Corporation, Waynesboro, Va.

[21] Appl. No.: 08/990,299

[22] Filed: Dec. 15, 1997

Related U.S. Application Data

[63] Continuation of application No. 08/688,973, Jul. 31, 1996, Pat. No. 5,850,147, which is a continuation-in-part of application No. 08/320,514, Oct. 11, 1994, Pat. No. 5,576,631.

[51] Int. Cl.⁶ ........................................ G01R 15/12
[52] U.S. Cl. ................................ 324/761; 324/754
[58] Field of Search .................... 324/754, 755, 324/761, 762, 72.5; 439/482, 824, 700

[56] References Cited

U.S. PATENT DOCUMENTS

| | | |
|---|---|---|
| 3,157,455 | 11/1964 | Takano . |
| 3,255,430 | 6/1966 | Phillips . |
| 3,590,377 | 6/1971 | Sorger . |
| 4,019,162 | 4/1977 | Banning . |
| 4,431,255 | 2/1984 | Banning . |
| 4,528,500 | 7/1985 | Lightbody et al. . |
| 4,560,926 | 12/1985 | Cornu et al. . |
| 4,636,026 | 1/1987 | Cooney et al. . |
| 4,700,159 | 10/1987 | Jones, III . |
| 4,701,702 | 10/1987 | Kruger . |
| 4,721,903 | 1/1988 | Harsch et al. . |
| 4,749,943 | 6/1988 | Blank . |
| 4,783,624 | 11/1988 | Sabin . |
| 4,787,861 | 11/1988 | Kruger et al. . |
| 4,815,989 | 3/1989 | Dholoo . |
| 4,836,801 | 6/1989 | Ramirez . |
| 4,846,739 | 7/1989 | Mawby . |
| 4,935,696 | 6/1990 | DiPerna . |
| 4,983,909 | 1/1991 | Swart et al. . |
| 5,009,613 | 4/1991 | Langgard et al. . |
| 5,014,004 | 5/1991 | Kreibich et al. . |
| 5,021,001 | 6/1991 | Ramirez . |
| 5,032,787 | 7/1991 | Johnston et al. . |
| 5,034,749 | 7/1991 | Jungblurt et al. . |
| 5,175,493 | 12/1992 | Langgard ........................... 324/761 |
| 5,225,773 | 7/1993 | Richards . |
| 5,557,213 | 9/1996 | Reuter et al. ..................... 324/761 |

FOREIGN PATENT DOCUMENTS

| | | |
|---|---|---|
| 0127466 | 7/1985 | Japan . |
| 0098566 | 4/1988 | Japan . |

OTHER PUBLICATIONS

"Spring Plunger Contact", by Buyck et al., IBM Tech Disc. Bull., vol. 15, No. 1, Jun. 1972, p. 58.

*Primary Examiner*—Vinh P. Nguyen
*Attorney, Agent, or Firm*—Irah H. Donner; Pepper Hamilton LLP

[57] ABSTRACT

An electrical test probe assembly for loaded board testing includes a housing having a hollow interior, and first and second opposite shields positioned and axially slidable in the housing and outwardly biased against each other. The first and second opposite shields form first and second shield cavities, respectively. In addition, the electrical test probe assembly includes first and second opposite insulators positioned and axially slidable in the first and second shield cavities, respectively. The first and second opposite insulators form an insulator cavity extending along the housing. Finally, the electrical test probe assembly includes first and second opposite plungers positioned and axially slidable in the insulator cavity of the first and second opposite insulators and outwardly biased against each other.

34 Claims, 23 Drawing Sheets

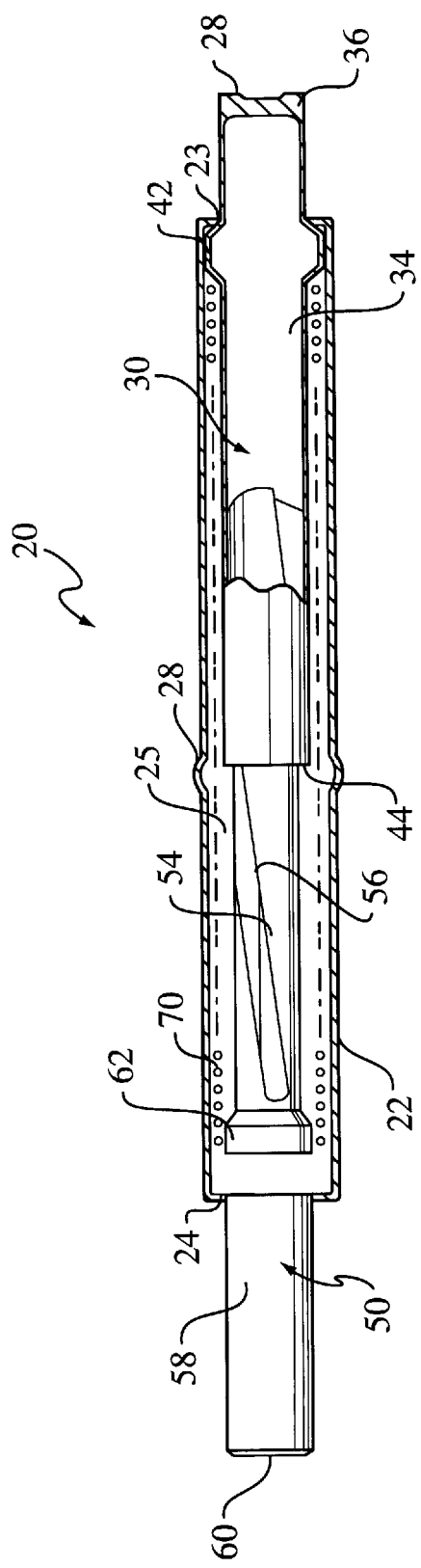
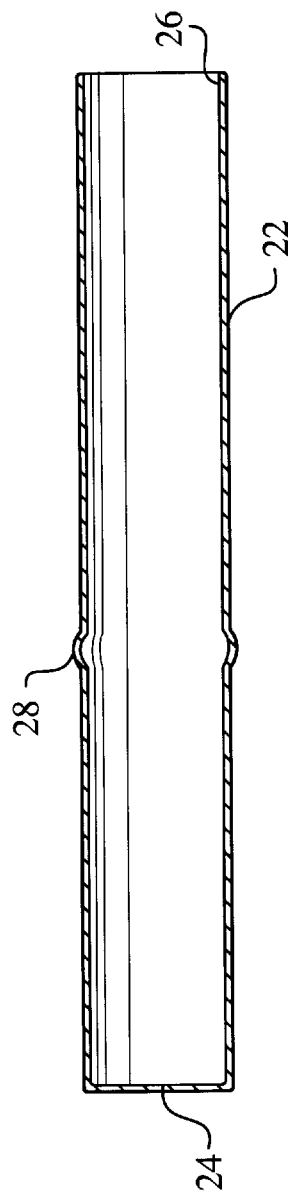
FIG. 1
FIG. 2

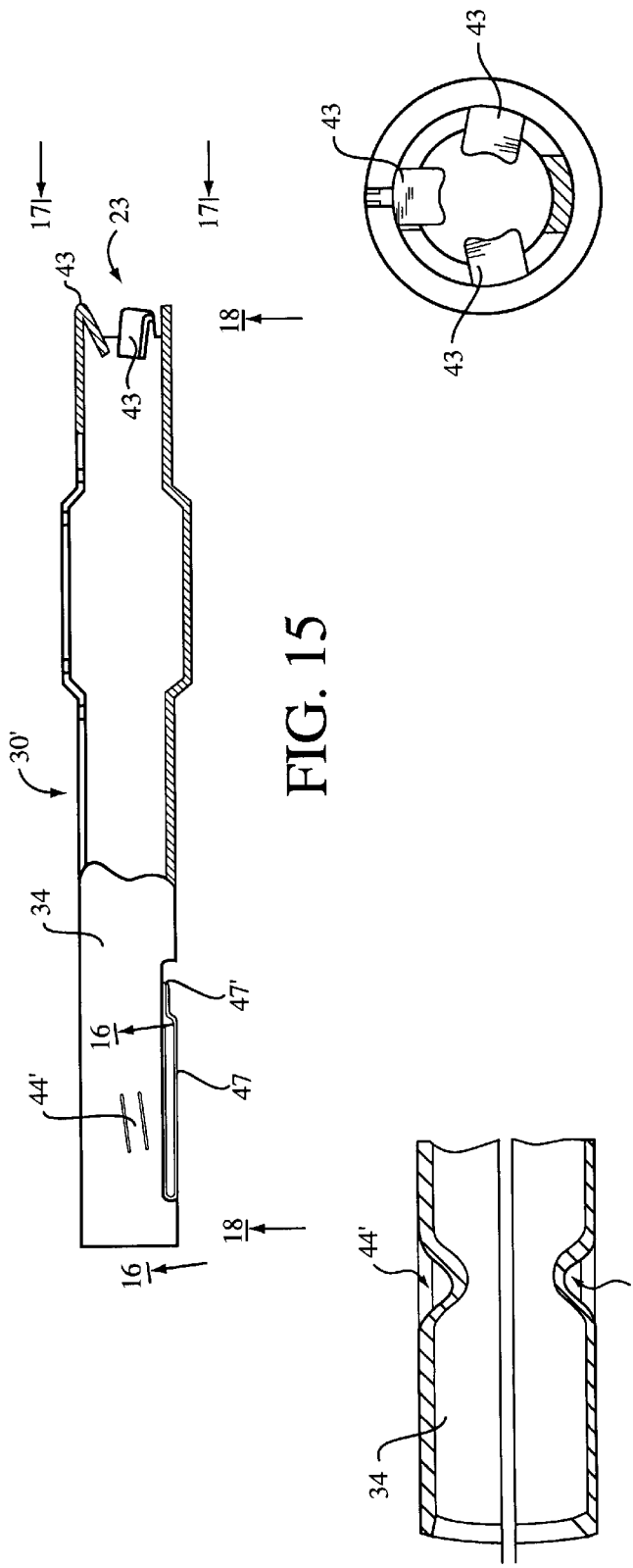
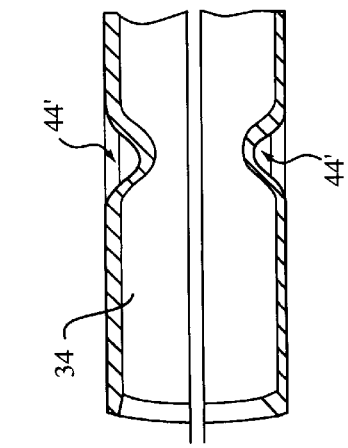
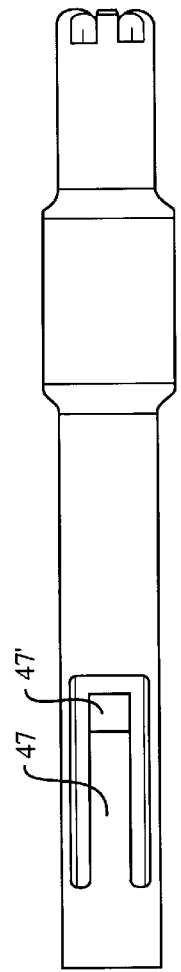

COAXIAL DOUBLE-HEADED SPRING CONTACT PROBE ASSEMBLY AND COAXIAL SURFACE CONTACT FOR ENGAGEMENT THEREWITH

RELATED APPLICATIONS

This application is a continuing U.S. application of application Ser. No. 08/688,973 filed Jul. 31, 1996, (now U.S. Pat. No. 5,850,147) which is a continuation-in-part of patent application Ser. No. 08/320,514, filed Oct. 11, 1994, now U.S. Pat. No. 5,576,631.

TECHNICAL FIELD

The invention relates to electrical probes and, more particularly, to miniature spring-loaded probes for providing electrical contact between electrical components having coaxial-type connections.

BACKGROUND ART

Testing, diagnosis, maintenance and calibration of electronic devices often require supplying test signals to, and receiving signals from, components of a Device Under Test (DUT) or Unit Under Test (UUT). When an electronic device is fabricated on one or more circuit boards, electronic components mounted on the circuit boards may not be accessible for testing using existing circuit board mounted connectors. Therefore, connections to components to be tested are made using external electrical probes applied to the exposed leads of the components and/or to a printed circuit board wiring layer.

Automatic testing of electrical circuits requires simultaneous connection to many circuit test points. The automatic testing equipment simultaneously supplies signals to, and receives signals from, combinations of test points. A conventional test fixture used to electrically probe a circuit card of a DUT includes a "bed of nails" having a platform for supporting the circuit card and an array of single headed spring probes. Each spring probe includes a probe head which makes positive electrical contact with an overlying portion of the circuit board being tested. An opposite end of each probe is connected to test equipment through single point wiring.

A conventional single headed electrical test probe is described by Johnston et al., U.S. Pat. No. 5,032,787 issued Jul. 16, 1991, incorporated herein by reference. The Johnston et al. patent describes a test probe assembly including a barrel having a hollow interior and a plunger which slides axially in the barrel. The plunger has an outer portion extending through an open end of the barrel, terminating in a contact tip outside the barrel for contact with a test point and a hollow, elongated receptacle extending through the barrel. The receptacle has a square or rectangular pilot hole so that an elongated fixed guide member in the barrel extends through the pilot hole. The guide member extends through the interior of the barrel away from the pilot hole and has an cuter surface which engages the pilot hole. A spring inside the barrel extends along the guide member and is biased against the internal end of the receptacle inside the barrel.

Axial travel of the Johnston et al. plunger into the barrel is against the spring bias. The outer surface of the guide member engages the correspondingly shaped pilot hole and controls rotational motion of the plunger as it travels along the guide member against the bias of the spring. The guide member is not free to rotate or axially translate through the barrel, i.e., rotate while being depressed in toward the barrel. End 58 of conductive guide member 54 projects out from the end of the barrel to provide an anti-rotational detail for the probe assembly. Cylindrical terminal portion 60 of the end cylindrical section 56 is described as being rigidly affixed to the inside of the barrel. Terminal portion 62 of the guide member projects outside the barrel to provide anti-rotation. Thus, the Johnston et al. probe is useful to connect a dedicated test lead to a single component or conductive layer on one circuit board via rotation of the guide member.

Another example of a conventional spring probe assembly is illustrated in Langgard, U.S. Pat. No. 5,175,493 issued on Dec. 29, 1992. The spring probe assembly includes an outer barrel having an open end and a remote end, an inner core of dielectric material, and an electrical contact spring probe. A shield surrounds the inner core between the barrel and the core and extends the full length of the barrel. The inner core is fixed within the outer barrel, and the shield is biased against the outer barrel. In one embodiment, a double ended probe assembly includes two electrical contact probes. The double ended probe assembly is the same as the single probe assembly, but the axial bore includes two spring probes in back-to-back relationship. An elongated barrel is used which has center connector pins joining the structure together. Thus, Langgard merely utilizes the same structure, and provides no unique structure for creating a double ended probe assembly. In addition, Langgard provides no method or structure whatsoever for effectively and efficiently connecting the shielded contact assembly with a coaxial conductor. Rather, Langgard requires end to end abutment or overlap and soldering techniques to provide a good electrical connection between the probe assembly and a coaxial conductor. Thus, in Langgard, the probe assembly is generally affixed to the coaxial conductor when the coaxial conductor is in use.

Since testing equipment and other electronic equipment must typically be adapted to varied uses, it is often necessary to reconfigure signal connections and condition signals to interface the equipment to a particular DUT. This can be accomplished by dedicated wiring, patch panels, and/or using appropriate signal routing/conditioning interface equipment in the form of a personality board. A personality board is connected between a testing device and a DUT to properly route and condition signals between the two devices. Thus, a testing device is electrically adapted to a particular DUT by using an appropriate personality board. Substitution of personality boards allows a single testing device to be used with a plurality of DUTs.

The testing device is connected to a personality board which, in turn, is connected to a test fixture holding the DUT using conventional electrical connectors and cabling. Thus, the personality board is used to electrically correct two devices. However, the additional wiring used to connect the personality board can impair signal connectivity and degrade the transmitted signals. The added connectors and cables also increase device cost and require additional mounting space on each circuit board and between circuit boards. Further, the device connectors are subject to misalignment and introduce maintenance and reliability problems. Multiple connectors and cabling also complicate the substitution of personality boards. Further, we have discovered that most prior art probes, such as Johnson et al., only provide one-sided connection where, as in Johnson et al. only the guide member rotates.

We have discovered, however, that a need exists for a connector system providing easy installation and replacement of circuit board mounted devices.

We have further discovered that a need exists for a low resistance electrical connector for interfacing circuits and wiring mounted on opposing circuit boards.

In addition, we have discovered that a need exists for a reconfigurable connector system for interfacing various nodes of an electronic device to a corresponding point of a second electronic device without intervening connectors.

We have further discovered that for more critical testing conditions where the transmitted signals are more susceptible to noise or environmental conditions, there is a need to transmit testing signals with higher accuracy.

We have also discovered that for more complicated testing conditions where many signals are required to be transmitted between the DUT and the testing device via the personality board, there is a need to more effectively and efficiently utilize the limited space to transmit these greater number of testing signals.

We have also discovered that it is desirable to effectively and efficiently connect a coaxial shielded contact assembly with a coaxial conductor.

We have also discovered that it is desirable to eliminate the need for end to end abutment or overlap and soldering techniques to provide a good electrical connection between the probe assembly and a coaxial conductor.

We have also discovered that it is desirable to eliminate the need for the probe assembly to be affixed to the coaxial conductor.

We have further discovered that it is desirable that the structure of the coaxial spring probe assembly permit all components to be movably connected to one another.

DISCLOSURE OF THE INVENTION

A feature and advantage of the invention is to provide a connector and connector system permitting ready installation and replacement of circuit boards requiring frequent changing.

Another feature and advantage of the invention is to provide a connector and connector system for directly connecting electronic circuitry on opposing parallel circuit cards.

Another feature and advantage of the invention is to provide a low loss signal path between electronic devices.

A further feature and advantage of the invention is to provide a universal array of connectors for electrically interfacing a variety of electronic devices.

Another feature and advantage of the invention is to transmit testing signals with higher accuracy for more critical testing conditions where the transmitted signals are more susceptible to noise or environmental conditions.

Another feature and advantage of the invention is to more effectively and efficiently utilize the limited space to transmit a greater number of testing signals for more complicated testing conditions where many signals are required to be transmitted between the DUT and the testing device via the personality board.

Another feature and advantage of the invention is to effectively and efficiently connect a coaxial shielded contact assembly with a coaxial conductor.

Another feature and advantage of the invention is to eliminate the need for end to end abutment or overlap and soldering techniques to provide a good electrical connection between the probe assembly and a coaxial conductor.

Another feature and advantage of the invention is to eliminate the need for the probe assembly to be affixed to the coaxial conductor.

Another feature and advantage of the invention is to provide a coaxial spring probe assembly that permits many or all components therein to be movably connected to one another.

According to one aspect of the invention, a doubleheaded spring contact probe for loaded board testing includes a barrel having a hollow interior and opposite plungers which slide axially and are free to rotate, in the barrel. The plungers have outer portions which extend through opposite open ends of the barrel, each terminating in a contact tip outside the barrel for contacting a test point on a circuit board. One of the plungers has a hollow receptacle extending into the barrel with a rectangular or notched keyway opening into the receptacle. The other plunger has a twisted guide member extending through the barrel into the keyway of the other plunger whereby axial translation of the plungers relative to each other causes relative rotation thereof. A spring engages opposite shoulder or collar portions of the plungers to bias the plungers outwardly against opposite ends of the barrel. Necked portions of the barrel limit travel of the plungers out from the barrel.

Rotation of the probe ends improve the resultant contact of the probe with the circuit board under test or a companion personality board as the rotating ends sweep oxide off of the contact area. The invention also exhibits improved electrical conductivity between plungers by providing a straight line current path between plungers, conductivity between the plungers provided by engagement of the guide member at the keyway opening. The double-headed construction further accommodates direct Printed Circuit (PC) board to PC board electrical connection.

According to another aspect of the invention, an electrical probe includes a housing having first and second opposite open ends. A first elongated plunger is partially positioned within the housing. A first portion of the first plunger extends out from the housing through the first opening end and terminates in a first electrical contact probe. A second portion of the first elongated plunger is rod-like, and is lengthwise contiguous with the first portion. The second portion is positioned within the housing and includes a bearing surface for transmitting a torque.

A second elongated plunger is likewise partially positioned within the housing. A first portion extends out from the housing through the second open end of the housing and terminates in a second electrical contact probe head. The second portion of the second elongated plunger is tubular, lengthwise contiguous with the first portion, and is positioned within the housing. The second rod-like portion of the first elongated plunger is centrally positioned within the hollow second portion of the second elongate plunger. An aperture within the second portion of the second elongated plunger engages the bearing surface of the first elongated plunger.

A compression spring is positioned within the housing and is positioned to engage the first and second plungers, biasing the plungers outward from the housing. The ends of the housing have restricted apertures for limiting axial travel of the first and second elongate plungers out from the housing.

According to a feature of the invention, one or more spiral channels are formed along a length of the second portion of the first elongate plunger, the bearing surface being formed by one or more walls of one or more channels. The aperture in the second elongate member may comprise a keyway and the second portion of the first elongate plunger may comprise a cylindrical member having a helical channel forming the bearing surface for engaging the keyway. The helical channel may subtend a radial angle of between 90 and 150 degrees over the length of the second portion of the first elongate plunger, an angle of 120 degrees plus or minus five degrees being preferred.

In a further improvement or additional embodiment of this invention, the plunger barrel portion is designed for increased electrical contact with the plunger and its spiral groove. Specifically, in this embodiment, the keyway for engaging the plunger channel is disposed at about a 6° angle to the axis thereof so that the keyway will ride in the plunger channel. In addition, a leafspring is disposed along the keyway on the barrel to contact the plunger as it translates along the length of the barrel. Finally, the plunger barrel portion which normally receives a solid probe may have mutually spaced leaves inwardly crimped from the end thereof to engage the probe and retain the same in the barrel plunger.

In another embodiment of the invention an electrical test probe assembly for loaded board testing includes a housing having a hollow interior, and first and second opposite shields positioned and axially slidable in the housing and outwardly biased against each other. The first and second opposite shields form first and second shield cavities, respectively. In addition, the electrical test probe assembly includes first and second opposite insulators positioned and axially slidable in the first and second shield cavities, respectively. The first and second opposite insulators form an insulator cavity extending along the housing. Finally, the electrical test probe assembly includes first and second opposite plungers positioned and axially slidable in the insulator cavity of the first and second opposite insulators and outwardly biased against each other.

In addition, a method of providing electrical connection using a double-headed spring contact probe for loaded board testing is provides. The method includes the steps of providing a barrel for the double-headed spring contact probe, and providing first and second shields having first and second shield cavities to axially slide in the barrel and to transmit a first signal through the double-headed spring contact probe via the first and second shields. The method further includes the steps of outwardly biasing the first and second shields, and providing first and second insulators to axially slide in the first and second shield cavities of the first and second shields respectively. The method also includes the steps of providing first and second plungers to axially slide relative to each other in the insulator cavity formed by the first and second insulators, and to transmit a second signal through the double-headed spring contact probe which is electrically insulated from the first signal, and outwardly biasing the first and second plungers.

An electrical test probe assembly for loaded board testing includes a housing having a hollow interior and first and second opposite shields. The first and second opposite shields are positioned and axially slidable in the housing. The first and second opposite shields form a shield cavity and have respective first and second shield ends. At least one of the first and second shield ends is tapered for engagement with an external surface having a corresponding taper. The electrical test probe assembly also includes first and second opposite insulators positioned in the shield cavity. The first and second opposite insulators form an insulator cavity extending along the housing. The electrical test probe assembly also includes first and second opposite plungers positioned and axially slidable in the insulator cavity of the first and second opposite insulators and are outwardly biased.

A coaxial surface contact connecting with a coaxial cable includes a cable center conductor, cable insulator and cable shield. A first shield forms a first shield cavity, and a second shield connects to the first shield cavity and forms a second shield cavity. The coaxial surface contact also includes an insulator positioned in at least a portion of the first and second shield cavities, and the insulator forms an insulator cavity. A plunger is positioned in the insulator cavity of the insulator. The coaxial surface contact also includes the first coupling connected to the plunger. The first coupling receives the cable center conductor to electrically connect the cable center conductor to the plunger, and a second coupling connects to the second shield. The second coupling receives the cable shield to electrically connect the cable shield to the second shield.

The foregoing and other objects, features, aspects and advantages of the present invention will become more apparent from the following detailed description of the present invention when taken in conjunction with the accompanying drawings.

BRIEF DESCRIPTION OF DRAWINGS

FIG. 1 is a partial cross sectional view of a double-headed twist probe according to the invention;

FIG. 2 is a sectional view of a probe housing prior to insertion of plungers and crimping of the open insertion end;

FIG. 15 is a partial sectional view similar to FIG. 3 illustrating an alternative embodiment of the plunger barrel portion;

FIG. 16 is a view taken along lines 16—16 of FIG. 15;

FIG. 17 is a view taken along lines 17—17 of FIG. 15;

FIG. 18 is a view taken along lines 18—18 of FIG. 15;

BEST MODE FOR CARRYING OUT THE INVENTION

Figure 3:
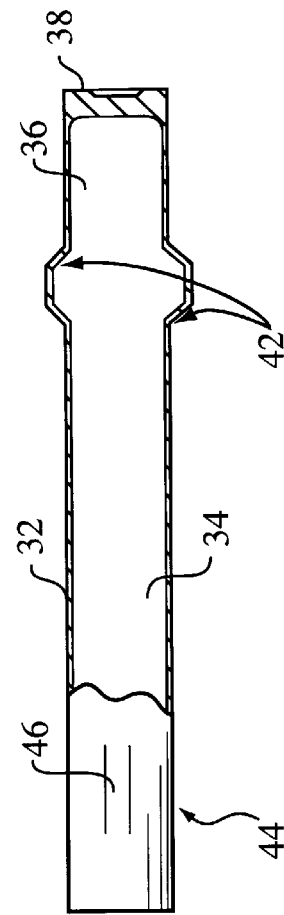
FIG. 3 is a partial sectional view of a plunger barrel portion.

Referring to FIG. 1, a miniature double-headed twist probe 20 includes a hollow tubular housing 22 having open ends 23 and 24. A tubular plunger 30 is slidably positioned within central cavity 25 of housing 22, extending outward through aperture 23 and terminating in contact tip 38. An internal barrel portion 34 of plunger 30 is coaxial with housing 22, extending approximately to the midpoint of the housing. Opposing rod-like plunger 50 is slidably positioned within an opposite portion of cavity 25, extending out from housing 22 through aperture 24 and terminating in contact tip 60. An internal twisted rod portion 54 of plunger 50 is shaped like a drill bit or slotted helix, extending through a matching aperture or keyway 44 of barrel portion 34. Both plungers 30 and 50 are free to rotate and longitudinally translate within housing 22. External portions of plungers 30 and 50 are made of a conductive substance such as heat treated beryllium copper (BeCu) or hardened steel plated with gold over nickel. Housing 22 is preferably made of a material such as deep drawn gold plated brass or nickel silver.

Plunger 30 includes lengthwise contiguous internal hollow tubular or barrel portion 34 and external probe portion 36 which axially extends out through an aperture in an end of housing 22. A shoulder portion 42 limits travel of plunger 30, maintaining the probe within housing 22 by engaging a restricted portion of the aperture formed by crimping or rolling. An inner face of shoulder portion 42 serves as a seat for spring 70 which biases plunger 30 outward from housing 22.

Plunger 50 axially extends through an opposite aperture in housing 22 and includes an internal twist rod portion 54 within the housing and an external probe portion 58 having a terminal contact tip 60. Internal twist rod 54 is helically formed and includes a twisted bearing surface 56. Internal twist rod 54 passes through an aperture forming a keyway 44 in an internal terminal end of barrel 34. Keyway 44 engages twist rod 54, including bearing surfaces 56 thereof so that axial travel of the plungers results in relative rotation thereof.

Spring 70 is positioned within cavity 25 of housing 22, coaxially surrounding barrel 34 and twisted rod 54 of the plungers. Spring 70 is made of a spring material such as stainless steel, music wire or beryllium copper and is positioned within housing 22. Opposite ends of spring 70 are seated on and engage shoulder portion 42 and collar portion 62 of plungers 30 and 50, respectively, thereby biasing the plungers outward from the housing. Inward travel of plungers 30 and 50 is against an outward bias provided by spring 70.

Housing 22 prior to assembly of the twist probe is shown in FIG. 2 of the drawings. The housing has a substantially tubular body with an aperture 24 formed at one end while an opposite end 26 remains open for insertion of the remaining probe components. A bulge in the housing forms press ring 28 for retaining the twist probe housing in a support member. After plunger 30, spring 70 and probe 50 are inserted into housing 22, open end 26 is rolled to form a lip, securing the components within the housing.

Figure 4:
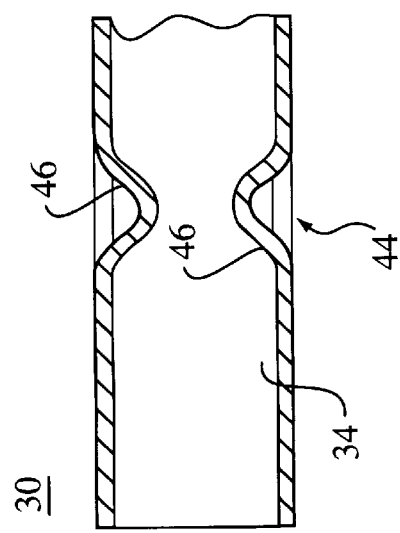
FIG. 4 is a partial sectional view of a barrel keyway;.
Figure 5:
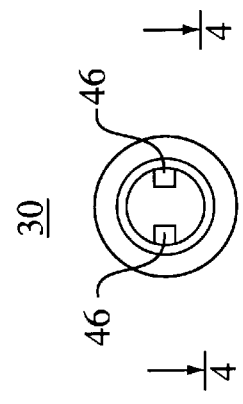
FIG. 5 is a partial cross-sectional view of a plunger barrel.

Plunger 30 is shown in greater detail in FIGS. 3–5 of the drawings. Therein, plunger 30 is made of a tubular material such as 360 brass plated with gold over nickel. Plunger 30 has an open internal barrel portion 34 and a closed external probe portion 36 terminating in contact tip 38. Shoulder portion 42 bath limits axial travel of the probe within housing 22, and provides a seating surface for engaging spring 70, biasing plunger 30 outward from housing 22. Keyway 44 includes crimped portions 46 forming tabs extending radially into the cavity 34 of internal barrel 32. These tabs are configured to engage bearing surface 56 of probe 50.

Figure 6:
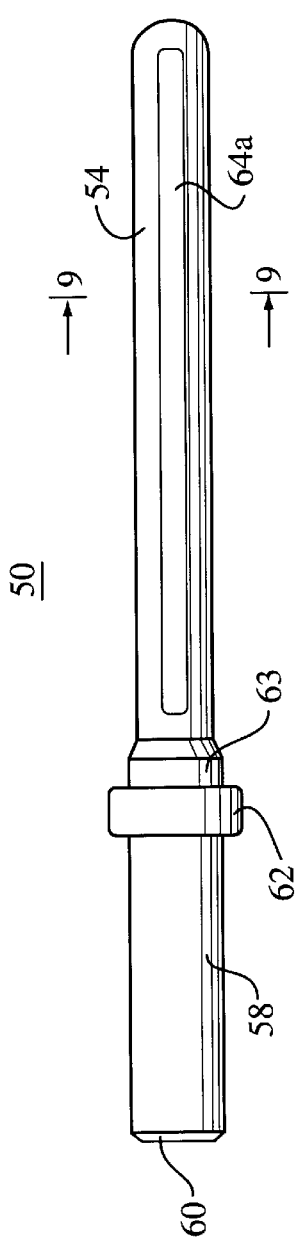
FIG. 6 is a side view of a plunger prior to twisting.
Figure 7:
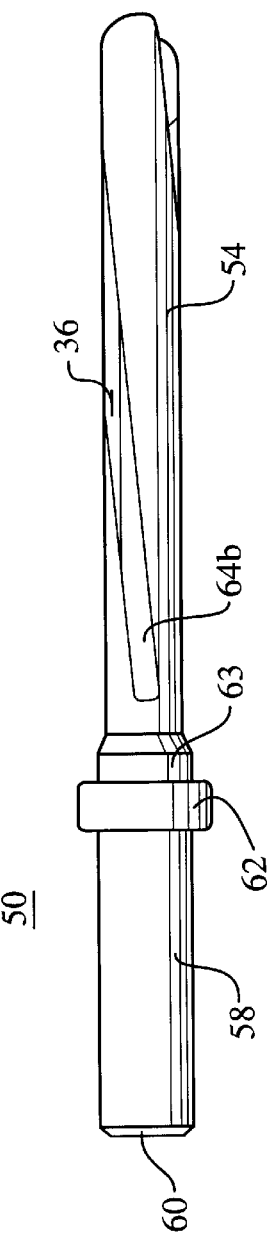
FIG. 7 is a side view of a plunger after twisting to form a spiral channel.
Figure 8:
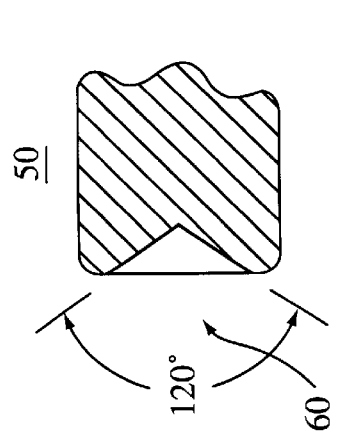
FIG. 8 is a part-al sectional view of a terminal end of a plunger forming an electrical contact probe head.
Figure 9:
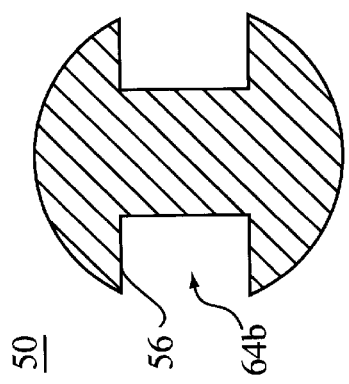
FIG. 9 is a cross-sectional view of a plunger showing channel detail.

Referring to FIGS. 6–9, plunger 50 includes an internal rod portion forming internal twist rod 54. Initially, as shown in FIG. 6, a straight channel 64a is formed in opposite sides of the surface of twist rod 54. The rod is then twisted 120 degrees as shown in FIG. 7 so that a spiral groove is formed by the twisted channel 64b. Channel 64b is configured to engage keyway 44 of plunger 30 whereby relative axial movement of the probes causes relative rotation of the probes. Collar portion 62 of plunger 50 limits axial travel of the probe and forms a seat for the opposite end of spring 70, biasing probe 50 outward of housing 22 against plunger 30. Shoulder portion 63 abuts collar portion 62 on the inner portion of plunger 50 and engages an inner surface of spring 70 to maintain coaxial alignment of the spring within housing 22.

Although the keyway and matching bearing surface of plungers 30 and 50 are shown as inward protruding tabs or "divots" engaging a channel, other geometric shapes can be used. For example, keyway 44 may comprise a rectangular aperture to engage a plunger having a corresponding mating rectangular cross-section. The tab/channel combination, however, has the advantage of increasing plunger-to-plunger contact surface area thereby minimizing electrical resistance through the probe.

A further embodiment of the plunger barrel shown in FIGS. 3–5 is provided in FIGS. 15–18. In that embodiment, the plunger barrel 30' mounts the inwardly protruding tab or "divot" 44'. However, it is disposed at an acute angle of about a 6° angle to the longitudinal axis of the plunger barrel 30' (or an obtuse angle if viewed in the opposite direction of 174°) to more precisely accommodate the spiral groove formed by the twisted channel 64b in twist rod 54. As will be obvious to those skilled in the art, by providing the keyway 44' at the angle shown, it will engage the channel 64b for better electrical connection. As shown in FIG. 16, the keyway 44' is provided on opposite sides of the barrel portion 34 to engage both the grooves 64b in the twist rod 54. In this way, the keyway 44' will engage the channels and continue to engage the channels during relative rotational movement of the plungers caused by relative movement thereof along the common longitudinal axis.

In addition, with attention to FIGS. 15 and 18, the barrel portion 34 also provides a leafspring 47 having a bearing surface 47' for contacting the plunger twist rod 54 as it moves axially through the barrel 30'. As shown in FIG. 18, the leafspring 47 is stamped from the barrel portion and is integral therewith.

Figure 10:
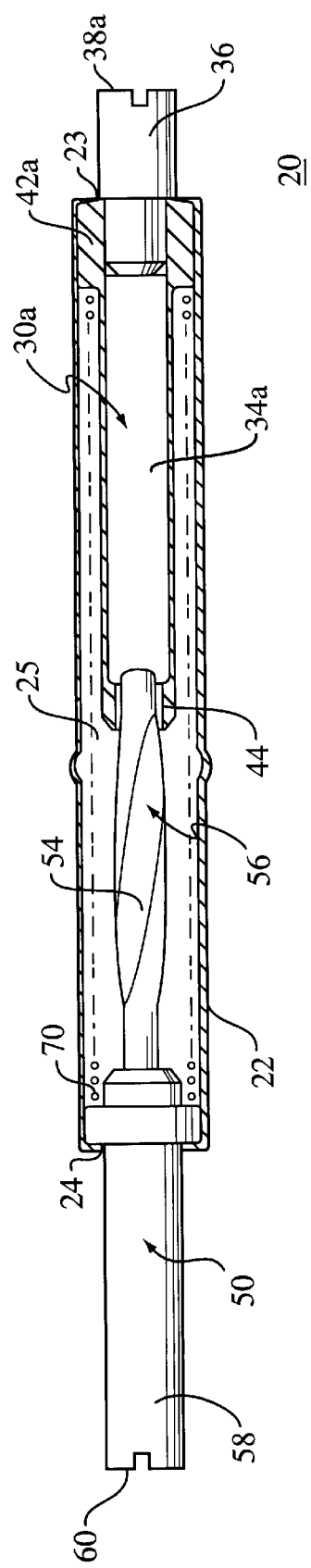
FIG. 10 is a partial sectional view of an alternate embodiment of a double-headed twist probe.

In another embodiment of the invention, spring 22 can be positioned within internal barrel 34 to bias plungers 30 and 50 axially outward from housing 22. An alternate construction of the double-headed twist probe is illustrated in FIG. 10. Housing 22 and plunger 50 are substantially the same as in the first embodiment of FIG. 1. However, plunger 30a is constructed of discrete portions including a barrel portion 34a having a distal end including collar portion 42a retaining a solid probe 36a. Although this embodiment requires more machining than is required by the first embodiment, the discrete solid probe 36a accommodates a greater variety of geometries for contact tip 38a.

As an alternative to collar portion 42a, as shown in FIGS. 15 and 17, leaves 43 may be provided around the circumference of the open distal end to facilitate retaining a solid probe. The leaves 43 are intended to engage a corresponding collar portion (not shown) of a probe 36 inserted therein.

Figure 11:
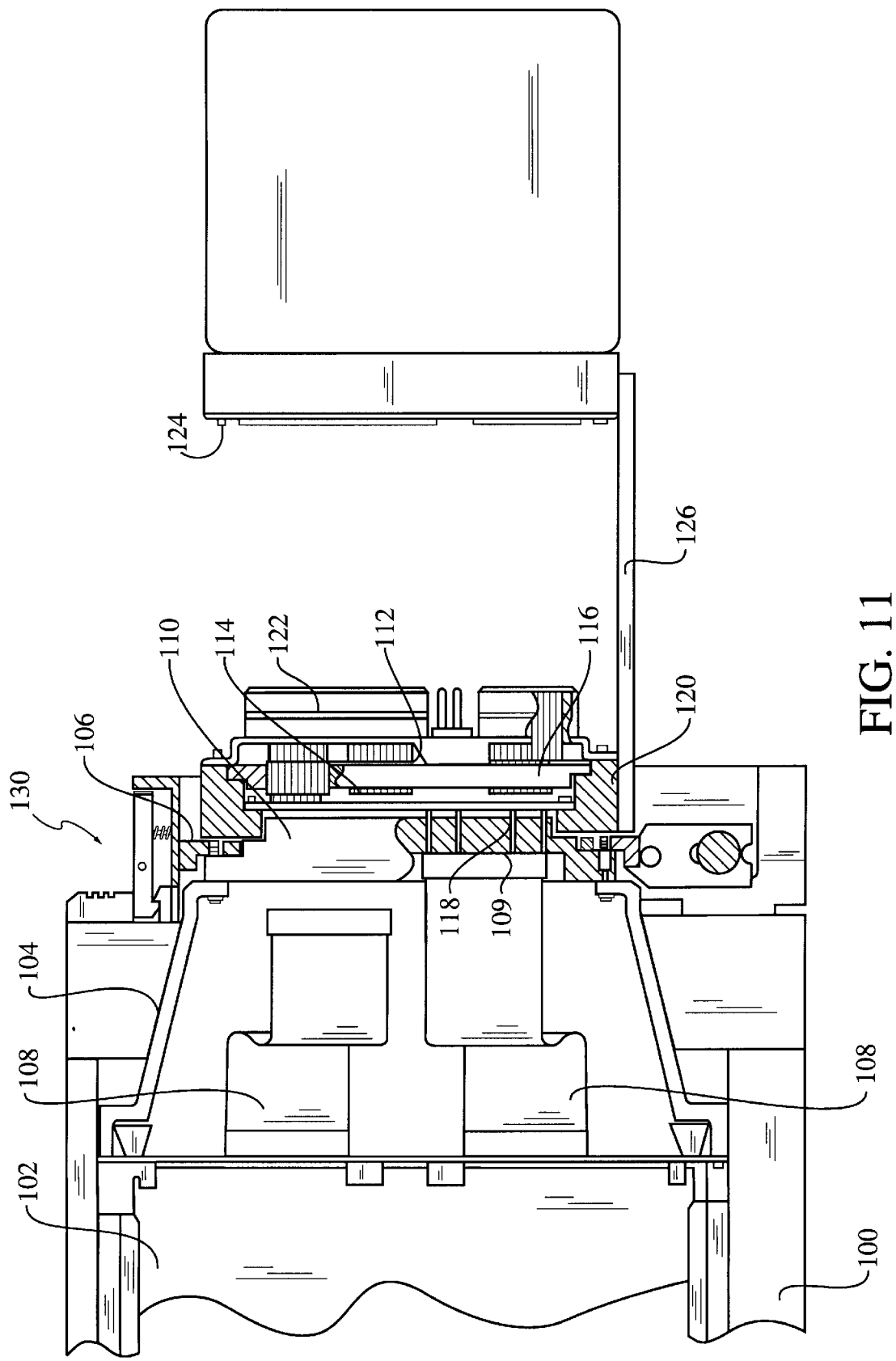
FIG. 11 is a partial sectional side view of a Twin Access Connector (TAC™) module including an array of double-headed twist probes providing electrical connectivity between components of a test device.

Another embodiment of the invention is shown in FIG. 11 wherein a plurality of twist probes are configured in an array to form a Twin Access Connector (TAC™) module for interfacing test-components with a personality board. A testing device 100 includes a plurality of test cards 102 housed in a card cage. Each test card 102 has attached, to a front plate thereof, an interconnect adaptor 104. The details of the interconnect adaptor can be found in allowed U.S. patent application, Ser. No. 07/585,800, filed Sep. 21, 1990, incorporated herein by reference. A rear TAC module 110 is attached to the front of interconnect adaptor 104, the combination being located by receiver frame 106. TAC module 110 includes a plurality of twist probes 118 providing electrical contact between terminal ends 109 of cables 108 and a personality board 114. An opposite face of personality board 114 engages twist probe connectors 112 of front TAC module 116 to provide electrical conductivity to connector 122. Device Under Test (DUT) 124 includes corresponding connectors to engage connector 122 and is supported by support plate 126.

The TAC modules shown in FIG. 11 permit rapid removal and replacement of personality board 114 to adapt testing equipment 110 to various DUTs 124. In particular, to change a personality board, receiver 130 is disengaged, thereby releasing the ITA 120 which contains front TAC module 116 and personality board 114. Upon minor disassembly of ITA 120 the personality board 114 can then be removed and replaced by a new personality board and ITA 120 can be reassembled. Upon engaging receiver 130, TAC module 116 is brought back into engagement with personality board 114. Because twist probes 118 rotate upon depression, oxide on connector pads and components of personality board 114 is removed, thereby creating a low resistance connection.

Figure 12:
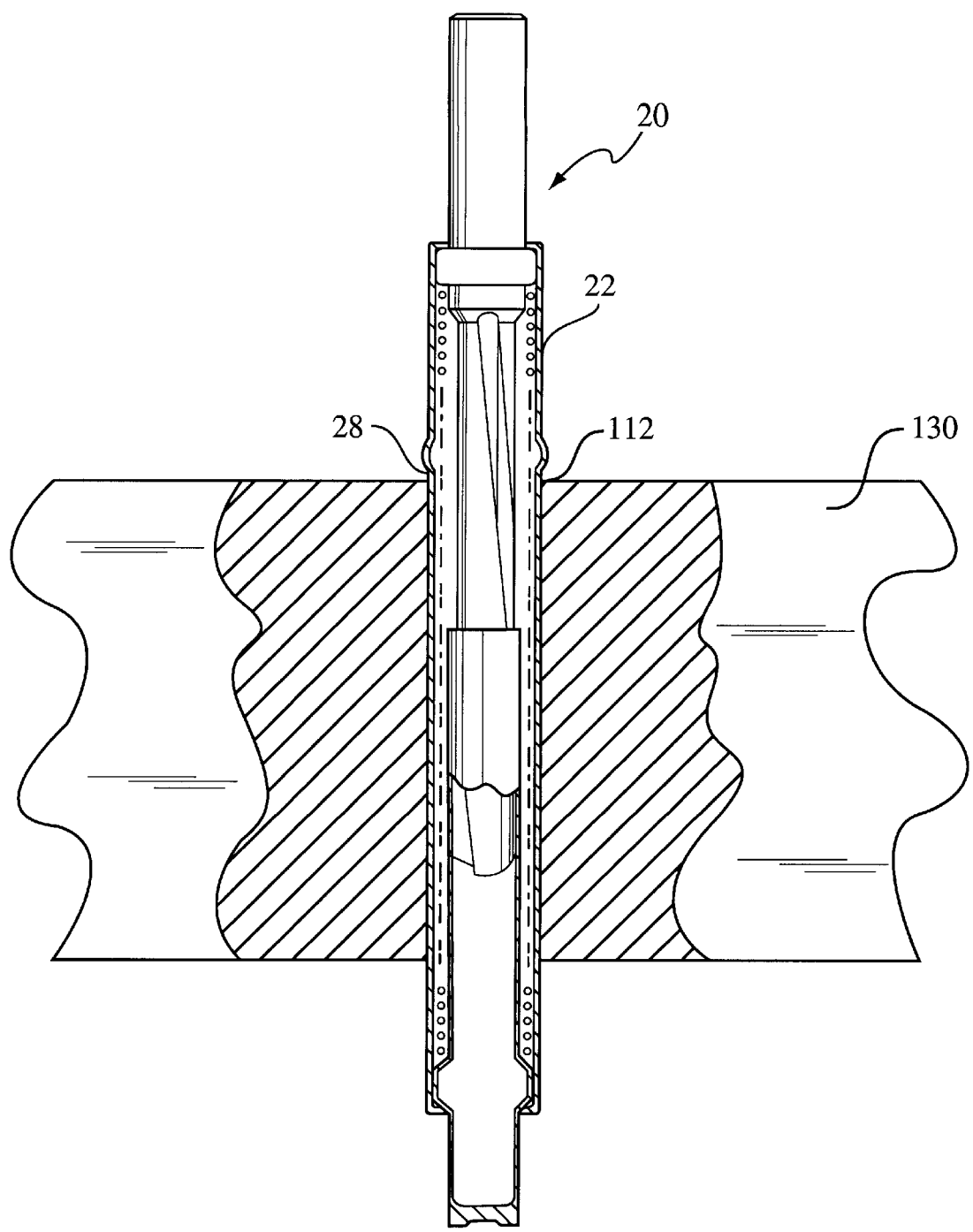
FIG. 12 is a partial sectional view of double-headed twist probe mounted in a module.

Mounting of a double-headed twist probe 20 in a TAC module 110 is shown in greater detail in FIG. 12. Housing 22 is inserted into an aperture 112 in frame 130 of module 110 until press ring 28 engages a front surface of the frame. Probe 20 is deformably retained in the aperture as shown. The frame may comprise an insulating substrate such as plastic with an array of through holes for receiving probes 20. Peripheral portions of frame 130 include mounting structures for securing the frame to the front of a card cage.

Figure 13:
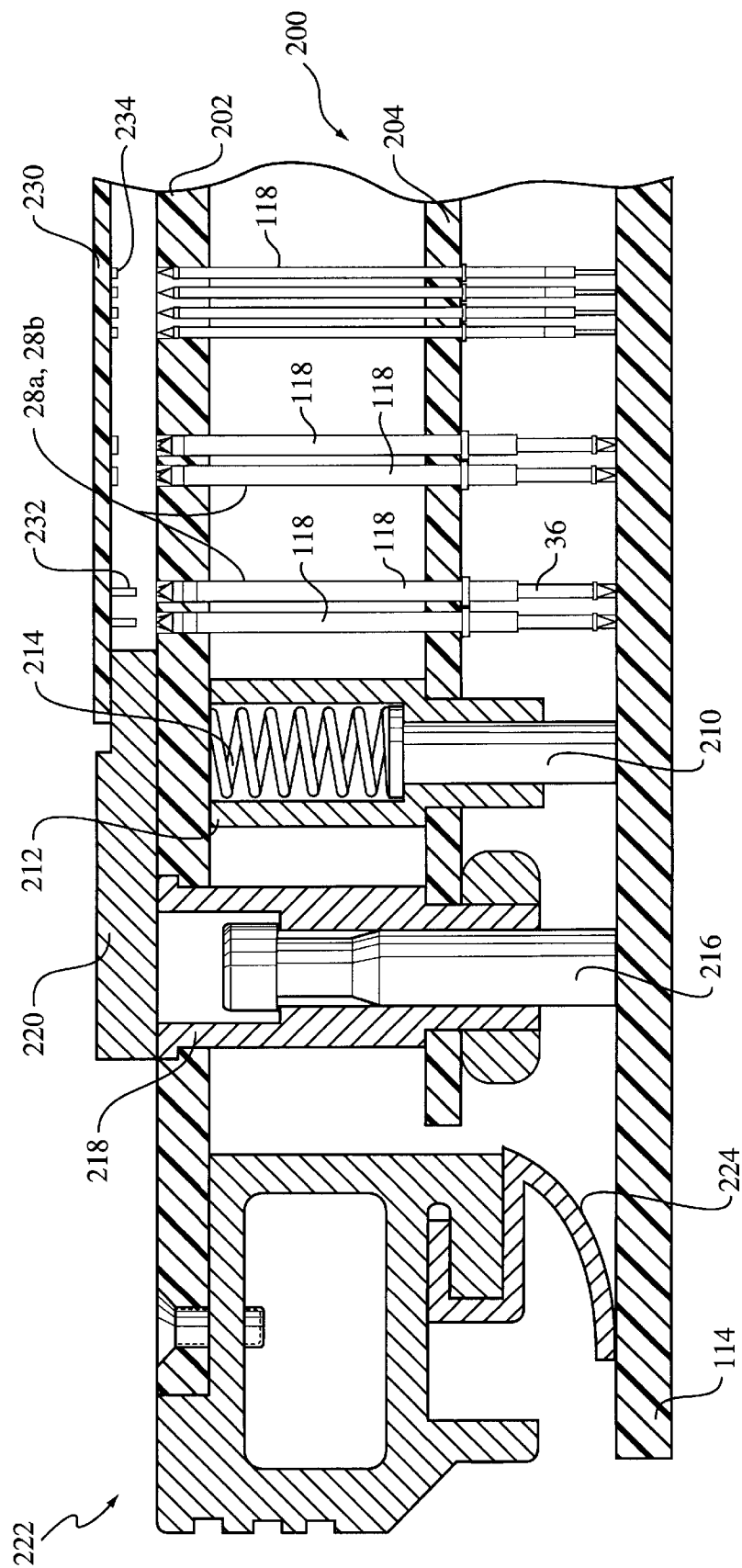
FIG. 13 is a partial sectional view of wireless fixture for interfacing a personality board to a printed circuit board under test.
Figure 14:
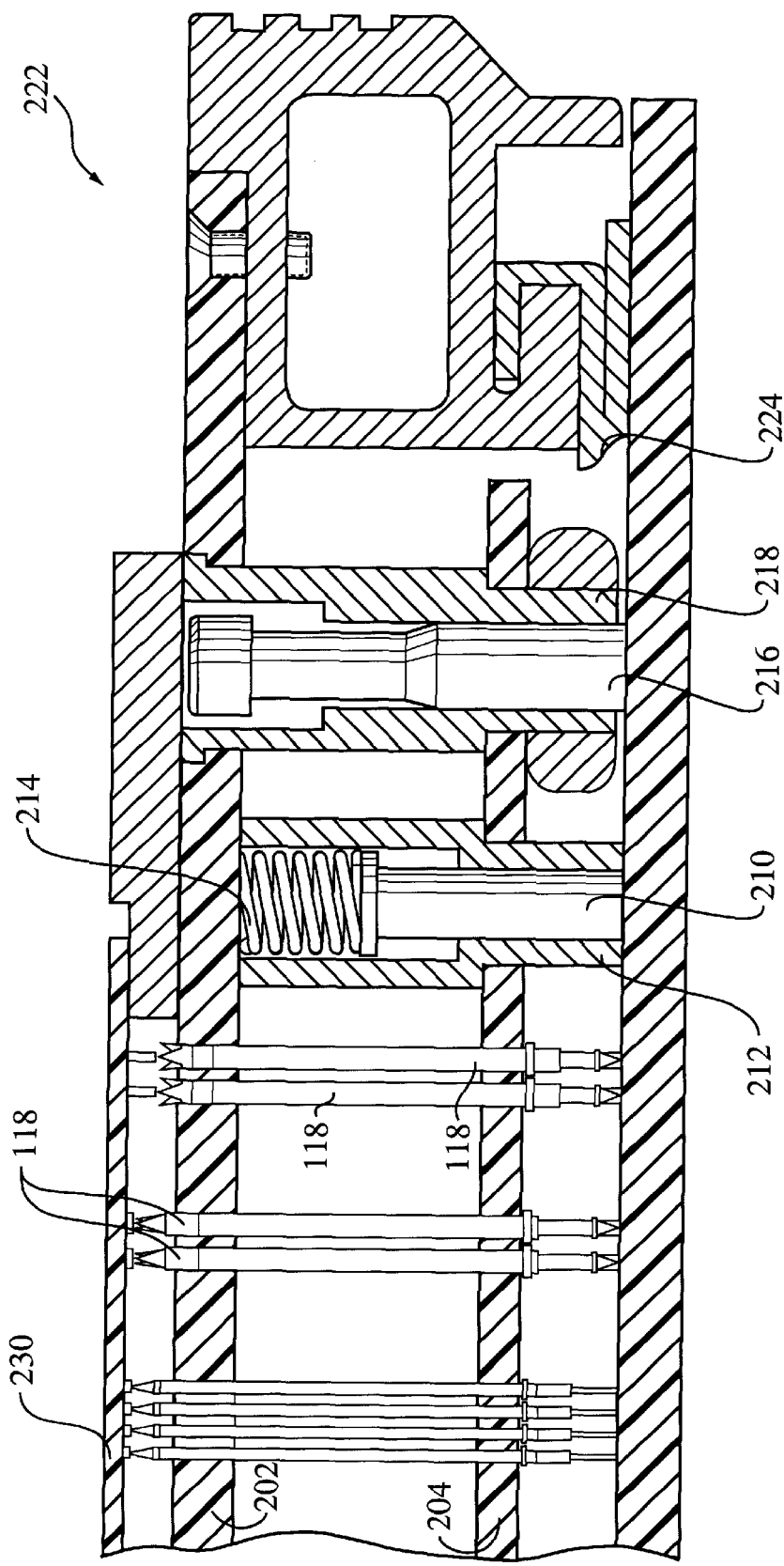
FIG. 14 is a partial sectional view of the wireless fixture shown in FIG. 13 with the printed circuit board positioned to engage the twist probes.

Another embodiment of the invention illustrated in FIGS. 13 and 14 incorporates a plurality of double-headed probes to directly interface a personality board to a circuit board under test. The probes may be double-headed helix twist probes. Referring to FIG. 13, an interface fixture 200 includes parallel top plate 202 and alignment plate 204. Plates 202 and 204 are made of a suitable electrical insulating material such as plastic with a plurality of aligned through holes. Probes 118 are positioned between the boards with opposite ends of the probes extending through respective vertically aligned through holes of plates 202 and 204. The through holes have diameters greater than a housing diameter of probes 118 positioned therein but less than the diameter of retaining rings 28a and 28b formed proximate opposite ends of the housings. Upward axial translation of probes 118 through the through holes is constrained by engagement of upper retaining ring 28a by surrounding portions of top plate 202 and downward translation is limited by lower retaining ring 28b engaging surrounding portions of alignment plate 204.

Fixture 200 is positioned above a personality board 114 so that lower external probe portions 36 of probes 118 engage contact pads formed on an upper surface of the personality board. Spring plungers 210 extend upward from personality board 114 and are retained within spring housings 212 provided at peripheral portions of the fixture. Return compression springs 214 are seated atop spring plungers 210 with opposite ends of the springs engaging top plate 202 to bias top plate 202 and alignment plate 204 upward. Upward travel of top plate 202 is limited by engagement of the head portions of spring plungers 210 with lower necked portions of spring housings 212.

Guide pins 216 and guide bushings 218 maintain alignment between the personality board 114, fixture 200 and a printed circuit board 230 of a unit under test (UUT). The guide pins 216 are positioned at peripheral portions of personality board 114 to engage corresponding guide bushings extending through top plate 202 and alignment plate 204 to engage UUT gasket 220. Peripheral portions of printed circuit board 230 rest on UUT gasket 220 to position the printed circuit board parallel to and above top plate 202.

A frame member 222 is positioned atop personality board 114 with fixture 200 and printed circuit board 230 located within the frame opening. A lower surface of frame member 222 includes a fixture gasket 224 made of a resilient material. The gasket provides a compressible air seal between frame member 222 and underlying personality board 114. An upper surface of frame member 222 includes a flange on which UUT gasket 220 is seated.

The combination of personality board 114, frame member 222, fixture 200 and printed circuit board 230 form a closed chamber. When the chamber is subjected to atmospheric pressure as shown in FIG. 13 frame member 222, fixture 200 and printed circuit board 230 resting thereon are biased upward, away from personality board 114 by return spring 114. In this "free state", component leads 232 and printed circuit pads 234 located an the lower surface of printed circuit board 230 are spaced above personality board 114 whereby the upper contact terminals of twist probes 118 are spaced apart from printed circuit board 230. Upon application of a vacuum source to the chamber, printed circuit board 230 is drawn down under atmospheric pressure into engagement with twist probes 118 as shown in FIG. 14. Alternate mechanical activation of the fixture is possible.

Figure 19:
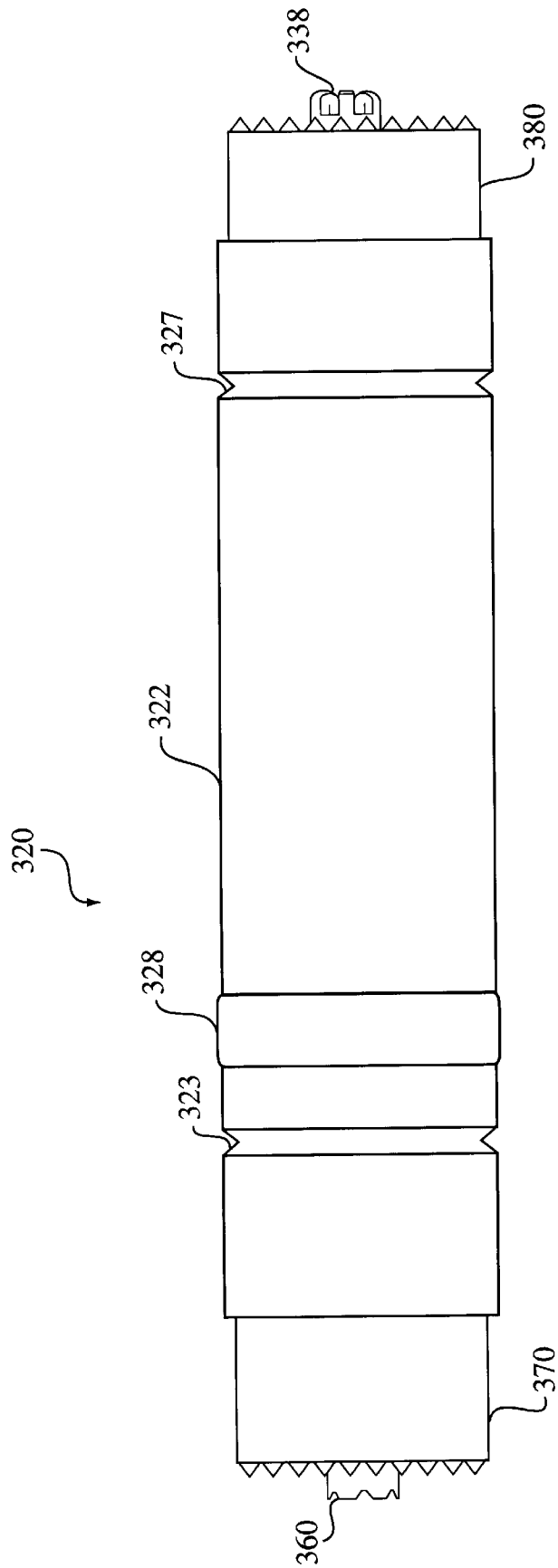
FIG. 19 is a view of a coaxial double-headed twist probe according to another embodiment of the invention.

FIG. 19 is a view of a coaxial double-headed twist probe according to another embodiment of the invention. In FIG. 19, coaxial double-headed twist probe 320 includes a tubular housing 322 with a bulge forming press ring 328 for retaining the coaxial twist probe housing in a support member in for example, frame 130 in TAC module 110 of FIGS. 11 and 12. Coaxial double-headed twist probe 320 also includes crimped portions 329 and 327 which prevent front and rear shields 370 and 380 from separating from tubular housing 322. Finally, coaxial double-headed twist probe 320 includes contact tips 360 and 338 for connection between, for example, test components and a personality board as illustrated in FIGS. 11 and 12.

Figure 20:
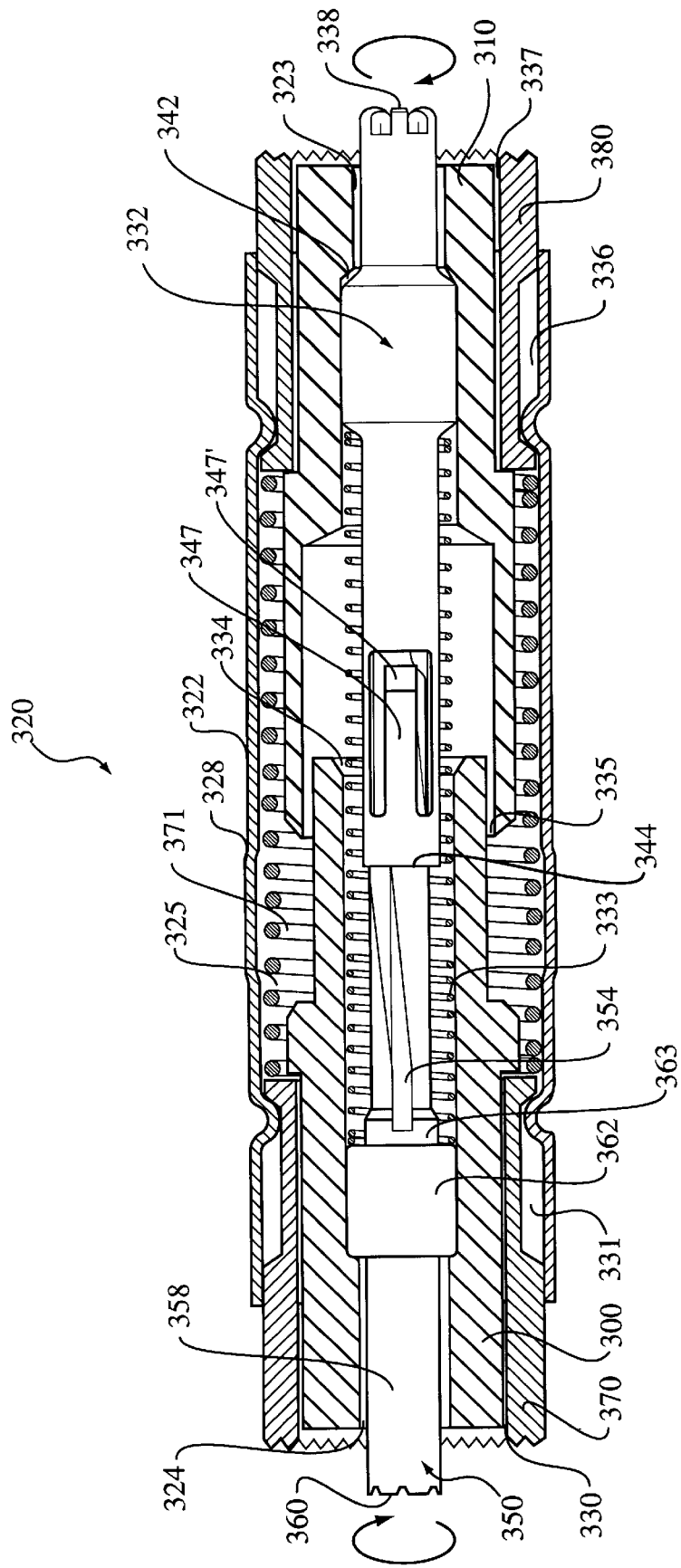
FIG. 20 is a partial cross sectional view of a coaxial double-headed twist probe according to another embodiment of the invention.

FIG. 20 is a partial cross sectional view of a coaxial double-headed twist probe according to another embodiment of the invention. In FIG. 20, coaxial double-headed twist probe 320 includes a tubular housing 322 with press ring 328 and open ends 331 and 336. A tubular plunger 332 is slidably positioned within rear insulator 310, extending outward through aperture 323 and terminating in contact tip 338. Tubular plunger 332 is coaxial with housing 322 and rear insulator 310. Opposing rod-like plunger 350 is slidably positioned within front insulator 300, extending out from housing 322 through aperture 324 and terminating in contact tip 360.

Front insulator 300 is coaxial with housing 322 and rear insulator 310. In addition, front insulator 300 is slidably positioned within rear insulator 310. Front and rear insulators 300 and 310 are partially disposed within open ends 330 and 337 of front and rear shields 370 and 380, respectively. Front and rear insulators 300 and 310 are biased by movement of the front and rear shields 370 and 380. In addiction, front and rear shields 370 and 380 are biased against each other via spring 371 disposed within cavity 325 of housing 322. Spring 371 is preferably made of a spring material such as stainless steel, music wire or beryllium copper. Inward travel of front and rear shields 370 and 380 is against an outward bias provided by spring 333. While spring 371 is shown as a spirally wound structure, other spring mechanisms are also contemplated which can outwardly bias front and rear shields 370 and 380.

An internal twisted rod portion 354 of plunger 350 is shaped like a drill bit or slotted helix, extending through a matching aperture or keyway 344 of plunger 332. Plunger 350 is preferably identical to plunger 50 illustrated in FIGS. 6 and 7. In addition, plunger 332 is preferably identical to plunger 30' illustrated in FIGS. 15–18. Both plungers 332 and 350 are free to rotate and longitudinally translate within housing 322 and front and rear insulators 300 and 310. External portions of plungers 332 and 350 are preferably made of a conductive substance such as heat treated beryllium copper (BeCu) or hardened steel plated with gold over nickel. Housing 322 is preferably made of a material such as deep drawn gold plated brass or nickel silver.

Plunger 332 includes lengthwise contiguous an internal barrel portion and an external probe portion which axially extends out through aperture 323 of rear insulator 310 and housing 322. A shoulder portion 342 of rear insulator 310 limits travel of plunger 332, maintaining the plunger within housing 322 by engaging a restricted portion of the aperture formed by counter-sinking rear insulator at shoulder portion 342. The internal barrel portion of plunger 332 serves as a seat or stop for spring 333 which biases plunger 332 outward from housing 322 and against plunger 350.

Plunger 350 axially extends through an opposite aperture or cavity in front insulator 300 and includes an internal twist rod portion 354 within the front insulator and an external probe portion 358 having a terminal contact tip 360. Internal twist rod 354 is helically formed and includes a twisted bearing surface. Internal twist rod 354 passes through an aperture forming a keyway 344 in an internal terminal end of barrel 332. Keyway 344 engages twist rod 354 so that axial travel of the plungers 332 and 350 results in relative rotation of contact tips 338 and 360.

Although the keyway and matching bearing surface of plungers 330 and 350 are preferably comprised of inward protruding tabs or "divots" engaging a channel as shown in FIGS. 3–5 and FIGS. 15–18. However, other geometric shapes can also be used. For example, keyway 344 may comprise a rectangular aperture to engage a plunger having a corresponding mating rectangular cross-section. The tab/channel combination, however, has the advantage of increasing plunger-to-plunger contact surface area thereby minimizing electrical resistance through the probe.

Spring 333 is positioned within the cavity of front and rear insulators 300 and 310, coaxially surrounding the barrel of plunger 332 and twisted rod 354 of plunger 350. Spring 333 is preferably made of a spring material such as stainless steel, music wire or beryllium copper. While spring 333 is shown as a spirally wound structure, other spring mechanisms are also contemplated which can outwardly bias plungers 332 and 350. Opposite ends of spring 333 are seated on and engage a shoulder portion of plunger 332 and shoulder and collar portions 363 and 362 of plunger 350, respectively, thereby biasing plungers 332 and 350 outward from the housing 322 and from each other. Inward travel of plungers 332 and 350 is against an outward bias provided by spring 333.

Figure 21:
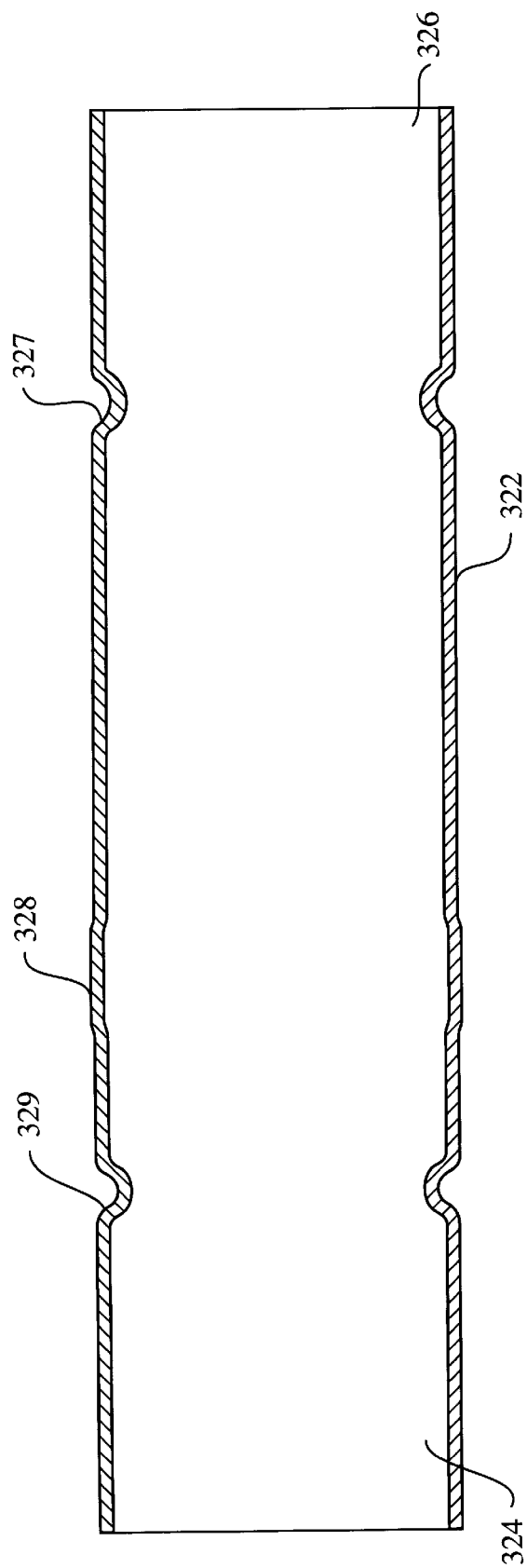
FIG. 21 is a sectional view of a probe housing prior to insertion of plungers and crimping of the coaxial double-headed twist probe of FIG. 20.

Housing 322, prior to assembly of the coaxial double-headed twist probe, is shown in FIG. 21 of the drawings. The housing has a substantially tubular body with an aperture 324 formed at one end while an opposite end 326 remains open For insertion of the remaining probe components. A bulge in the housing forms press ring 328 for retaining the twist probe housing in a support member. After plunger 330, spring 333 and plunger 350 are inserted into housing 322. Next, front and rear insulators 300 and 310 may be placed in housing 322 around plungers 332 and 350. Front and rear insulators are held in place via front and rear shields 370 and 380. Front shield 370 may be inserted via aperture 331 of housing 322 which is then crimped at 329 to secure the front insulator and front shield 300 and 370 structure. Rear shield 380 may be then inserted via aperture 336 of housing 322 which is then crimped at 327 to secure the rear insulator and rear shield 310 and 380 structure.

Figure 22:
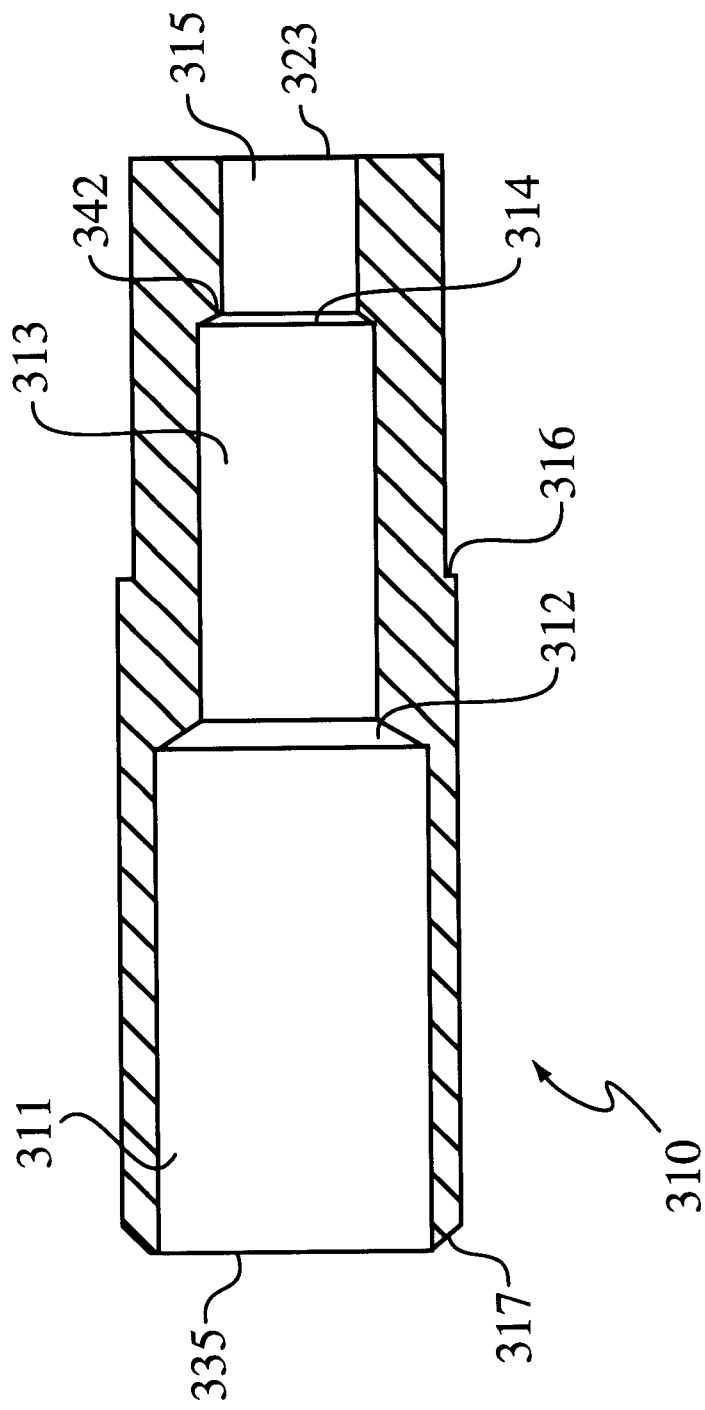
FIG. 22 is a sectional view of a rear insulator of the coaxial double-headed twist probe of FIG. 20.

FIG. 22 is a sectional view of a rear insulator of the coaxial double-headed twist probe of FIG. 20. As shown in FIG. 22, rear insulator 310 includes a first cavity 311 forming opening 335 for receiving front insulator 300, plungers 332 and 350 with spring 333 biasing plungers 332 and 350. Cavity 311 is counter-sinked at 312 to facilitate compression of spring 333. Rear insulator 310 further includes a second cavity 313 which is smaller than first cavity 311 for receiving the shoulder portion of plunger 332 and a portion of spring 333 which abuts the shoulder portion of plunger 332. Cavity 313 is counter-sinked at 314 to form shoulder portion 342 which limits travel of plunger 332.

Shoulder portion 342 maintains the plunger within housing 322 by engaging a restricted portion of the aperture formed by counter-sinking rear insulator at 314 forming shoulder portion 342.

Rear insulator 310 further includes third cavity 315 resulting in opening 323 for receiving contact tip 338 of plunger 332 and permitting contact tip 338 external contact. Rear insulator 310 also includes lip 316 which abuts rear shield 380 and which is influenced by rear shield 380. In particular, rear insulator 310 is driven inward toward the center of the coaxial double-headed contact probe 320 by the inward movement of rear shield 380. Rear insulator 310 further includes shaved tip 317 at opening 335 to facilitate compression of spring 371 upon the inner movement of front and rear shields 370 and 380.

Figure 23:
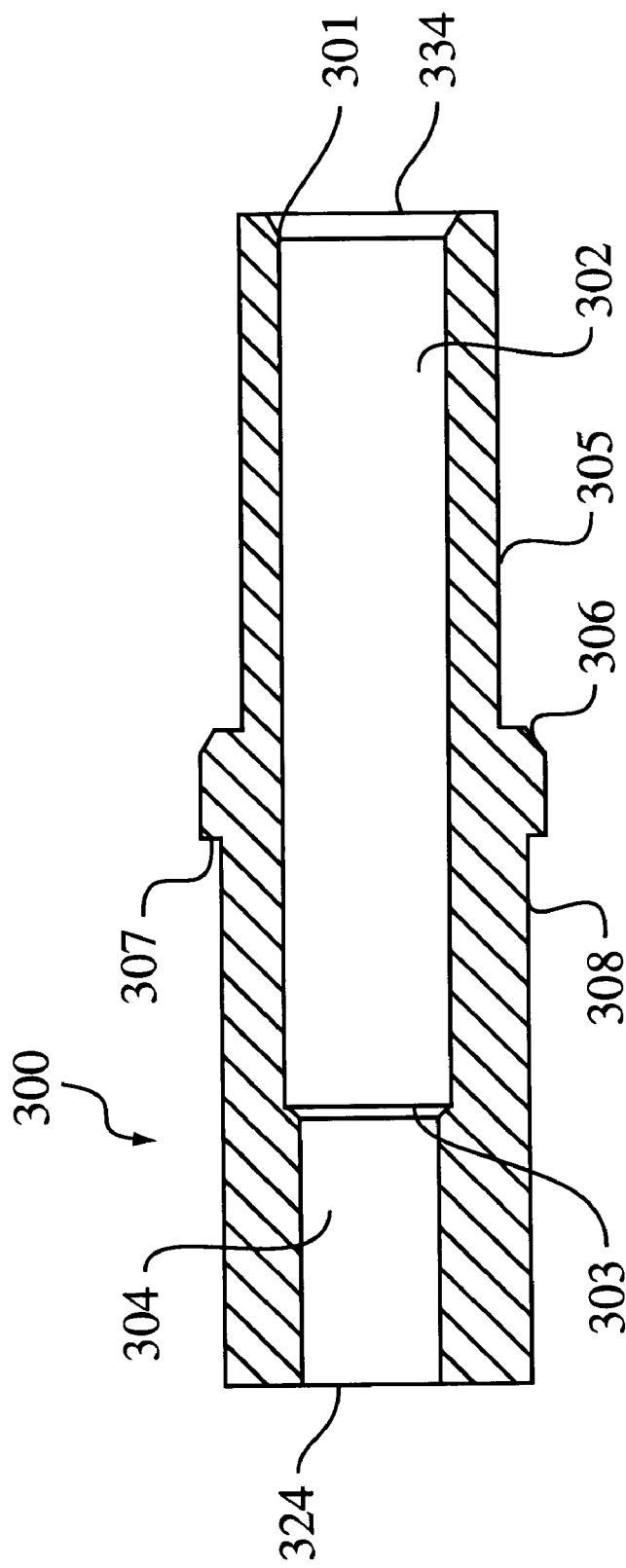
FIG. 23 is a sectional view of a front insulator of the coaxial double-headed twist probe of FIG. 20.

FIG. 23 is a sectional view of a front insulator of the coaxial double-headed twist probe 320 of FIG. 20. As shown in FIG. 23, front insulator 300 includes a first cavity 302 which is counter-sinked at 301 forming opening 334 for receiving plungers 332 and 350 with spring 333 biasing plungers 332 and 350. Cavity 302 is counter-sinked at 301 to facilitate compression of spring 333. Front insulator 300 further includes a second cavity 304 forming opening 324. Cavity 304 is smaller than the first cavity 302 for receiving the narrower external probe portion 358 of plunger 350 which includes contact tip 360. Cavity 304 is counter-sinked at 303 to facilitate engagement with the shoulder portion 362 of plunger 350. Cavity 304 and counter-sink 303 maintains the plunger 350 within housing 322 by engaging shoulder portion 362 with counter-sink 303.

Front insulator 300 also includes lip 307 adjoining section 308 which abuts front shield 370 and which is influenced by front shield 370. In particular, front insulator 300 is driven inward toward the center of the coaxial double-headed contact probe 320 by the inward movement of front shield 370. Front insulator 300 further includes shaved tip 306 at section 305 to facilitate compression of spring 371 upon the inner movement of front and rear shields 370 and 380. Section 305 is narrower than section 308 for insertion in opening 335 of rear insulator 310. Further, section 308 is constructed for insertion in opening 330 of front shield 300.

Front and rear insulators 300 and 310 may be made of any insulating material which is able to insulate the inner plunger combination of plungers 332 and 350 from housing 322, front and rear shields 370 and 380 and spring 371. Front and rear insulators 300 and 310 are preferably made of foamed polyethylene material which provides these acceptable characteristics while also being easy to work with and shape described above in connection with FIGS. 22 and 23.

Figure 24:
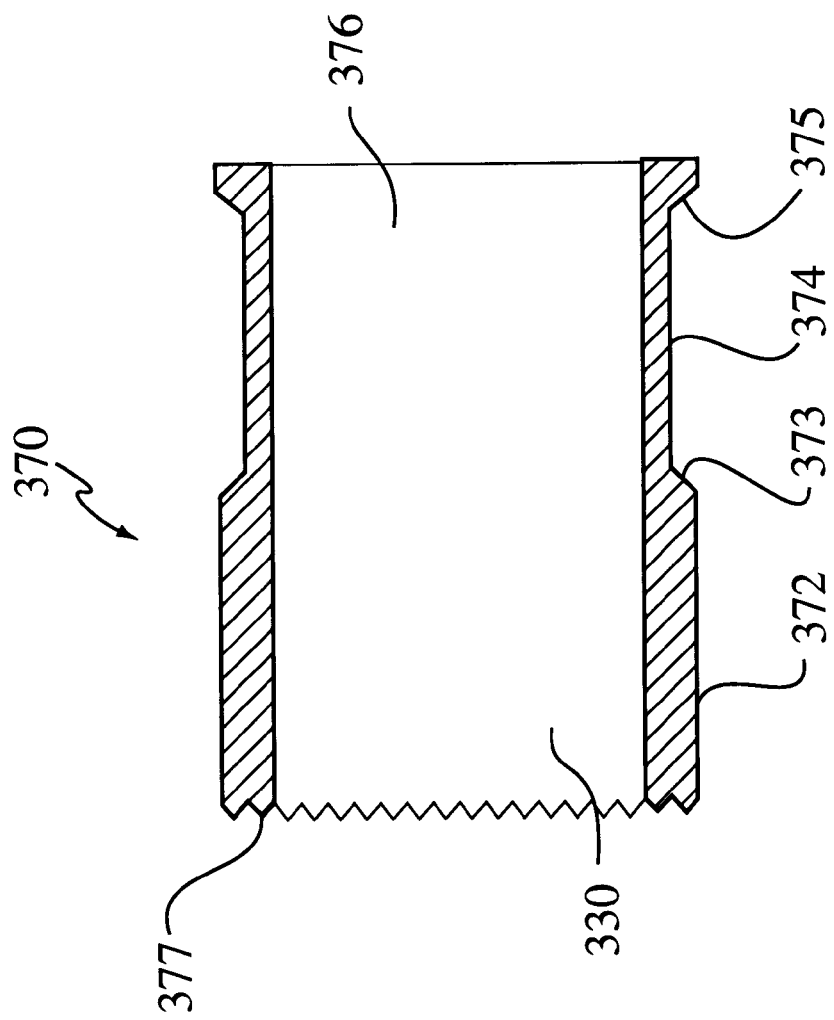
FIG. 24 is a sectional view of a front shield of the coaxial double-headed twist probe of FIG. 20.
Figure 25:
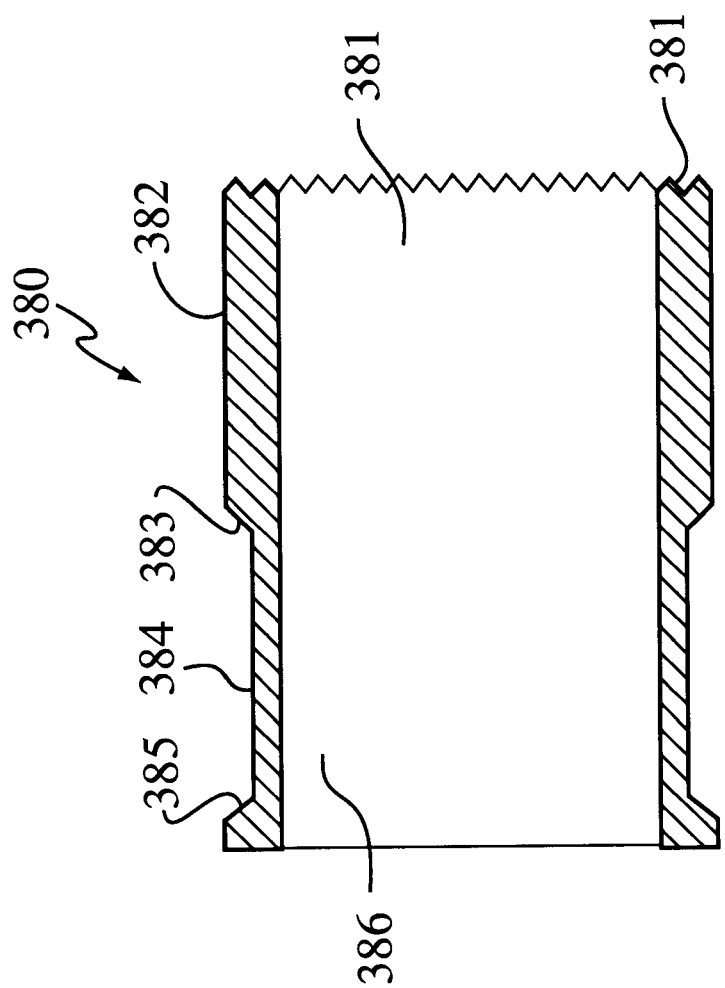
FIG. 25 is a sectional view of a rear shield of the coaxial double-headed twist probe of FIG. 20.

FIGS. 24 and 25 are sectional views of respective front and rear shields of the coaxial double-headed twist probe 320 of FIG. 20. FIG. 24 illustrates front shield 370 with opening 330 finely knurled to form saw teeth 377. Alternatively, instead of saw teeth 377, opening 330 may be in the shape of a flat ring. Front shield 370 also includes section 372 which is insertable in opening 331 of housing 322. Part of section 372 is external to housing 322 for contacting an external surface which may or may not be the same surface which is contacted by contact tip 360. Section 372 adjoins narrow section 374 which is bordered by angled or slanted surfaces 373 and 375 of front shield 370. Narrow section 374 is constructed to receive crimped portion 329 of housing 322. Angled surfaces 373 and 375 restrict the movement of front shield 370, i.e., angled surface 373 prevents front shield 370 from being inserted too far into housing 322, and angled portion 375 prevents front shield 370 from exiting housing 322. Angled surface 373 and 375 are angled to facilitate engagement with crimped portions 329 of housing 322 which have a similar angled surfaces.

FIG. 25 is a sectional view of rear shield 380 of the coaxial double-headed twist probe 320 of FIG. 20. In FIG. 25, rear shield 380 with opening 337 finely knurled to form saw teeth 381. Alternatively, instead of saw teeth 381, opening 337 may be in the shape of a flat ring for enhanced connection. Rear shield 380 also includes section 382 which is insertable in opening 336 of housing 322. Part of section 382 is external to housing 322 for contacting an external surface which may or may not be the same surface which is contacted by contact tip 338. Section 382 adjoins narrow section 384 which is bordered by angled or slanted surfaces 383 and 385 of rear shield 380. Narrow section 384 is constructed to receive crimped portion 327 of housing 322. Angled surfaces 383 and 385 restrict the movement of rear shield 380, i.e., angled surface 383 prevents rear shield 380 from being inserted too far into housing 322, and angled portion 385 prevents rear shield 380 from exiting housing 322. Angled surface 383 and 385 are angled to facilitate engagement with crimped portions 327 of housing 322 which have a similar angled surfaces.

Front and rear shields 370 and 380 may be any suitable conductive material, and are preferably made of a material such as gold plated brass or heat treated gold plated BeCu. Front and rear shields 370 and 380 provide for or conduct additional signals which may enhance the transmission of the signal through plungers 332 and 350 and spring 333 by providing ground potential with respect to the transmitted signal. Alternatively, front and rear shields 370 and 380 may provide a medium for simultaneously transmitting a second signal with the assistance of spring 371 and housing 322.

Front and rear insulators 300 and 310 are used to isolate or insulate the signal which is transmitted via plungers 332 and 350 with the assistance of spring 333 for fine or enhanced signal transmission. Note that for plungers 332 and 350, the signal transmitted therethrough is not conducted by housing 322 which significantly isolates the signal from the outside. In addition, front and rear insulators 300 and 310 are also used to insulate the signal which is conducted via front and rear shields 370 and 380 with the assistance of spring 371 and housing 322. In this application, it is presumed that the signal carried therethrough does not require the isolated conditions of the signal discussed above which is conducted through plungers 332 and 350 since this signal is conducted via housing 322 which may be adversely affected by the area or region which is external to the coaxial double-headed spring loaded contact probe. When front and rear shields 370 and 380 are used to conduct a second data signal, the coaxial double-headed twist probe provides the further advantage of transmitting two different signals while effectively and efficiently using the limited space allocated.

Figures 26, 27:
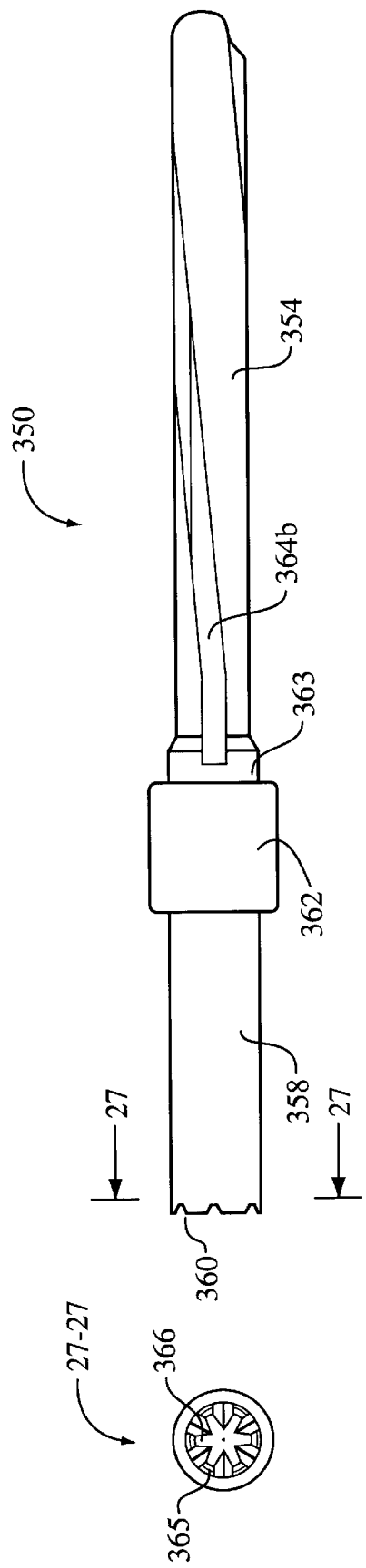
FIG. 26 is a side view of a plunger after twisting to form a spiral channel.
FIG. 27 is a cross-sectional view of a plunger taken along section lines 27—27 of FIG. 26.

FIG. 26 is a side view of a plunger after twisting to form a spiral channel. In FIG. 26, plunger 350 includes an internal rod portion forming internal twist rod 354. Plunger 350 is preferably similar to plunger 50 shown in FIGS. 6 and 7 where plunger 350 is twisted 120 degrees so that a spiral groove is formed resulting in twisted channel 364b shown in FIG. 26. Channel 364b is configured to engage keyway 344 of plunger 332 whereby relative axial movement of the plungers also causes relative rotation of the plungers. Collar portion 362 of plunger 350 limits axial travel of the probe and forms a seat for the opposite end of spring 333, biasing plunger 350 outward of housing 322 and against plunger 332. Shoulder portion 363 abuts collar portion 362 on the inner portion of plunger 350 and engages an inner surface of spring 333 to maintain coaxial alignment of the spring within housing 322.

FIG. 27 is a cross-sectional view of exterior portion 358 of plunger 350 taken along section lines 27—27 of FIG. 26. In FIG. 27, the exterior portion 358 near the contact tip 360 counter-sinked using a standard counter-sink tool to form counter-sink area 365. The exterior portion 358 is then slotted in a star shape using a standard V-shape cutting tool to form opening 366. Advantageously, this counter-sinked star-shaped opening provides the necessary structure to remove dirt or dust from the contact area of contact tip 360 by drawing the debris into star-shaped opening 366 or by expelling the debris from the contact tip.

Figure 28:
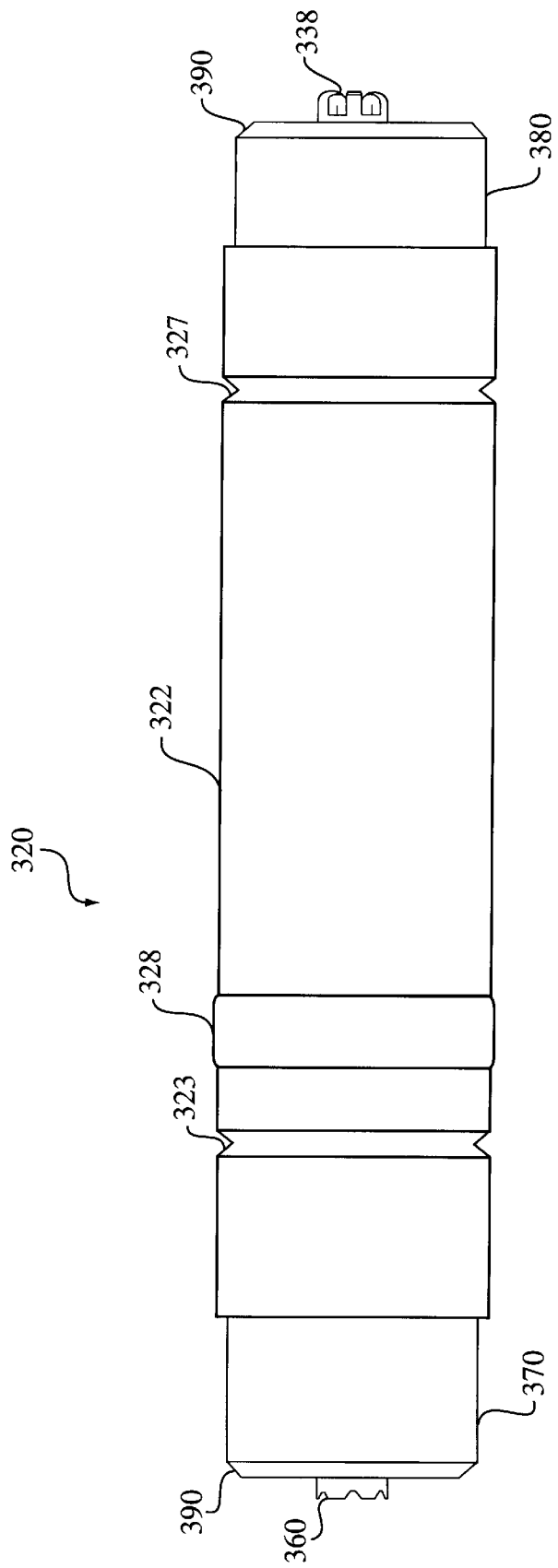
FIG. 28 is a view of a coaxial double-headed twist probe according to another embodiment of the invention.
Figure 29:
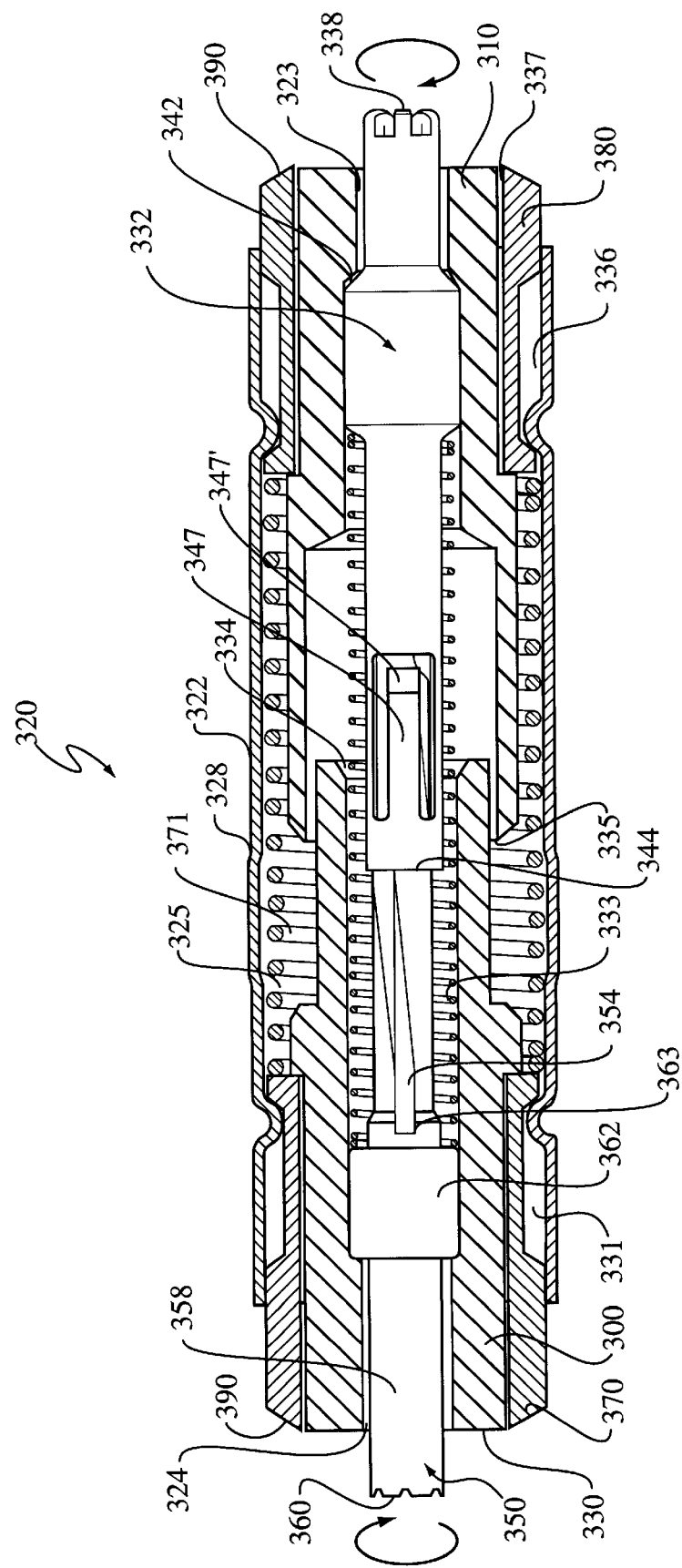
FIG. 29 is a partial cross sectional view of a coaxial double-headed twist probe according to another embodiment of the invention.

FIGS. 28–29 are views of a coaxial double-headed twist probe according to another embodiment of the invention. FIGS. 28–29 are similar to the coaxial double-headed twist probe illustrated in FIGS. 19–20, except with respect to including a tapered end shield. In FIGS. 28–29, both end shields 370, 380 include tapered ends 390. Tapered ends 390 facilitate electrical contact between the coaxial double-headed twist probe and an external electrical contact, such as a coaxial surface contact described in detail below. Note that while FIGS. 28–29 illustrate a coaxial double-headed twist probe assembly, a single-headed coaxial probe assembly may also be used with or without "twist" probes. Similarly, the coaxial double-headed probe assembly may also be constructed without the use of twist probes, but rather using probes that are merely outwardly biased.

Figure 30:
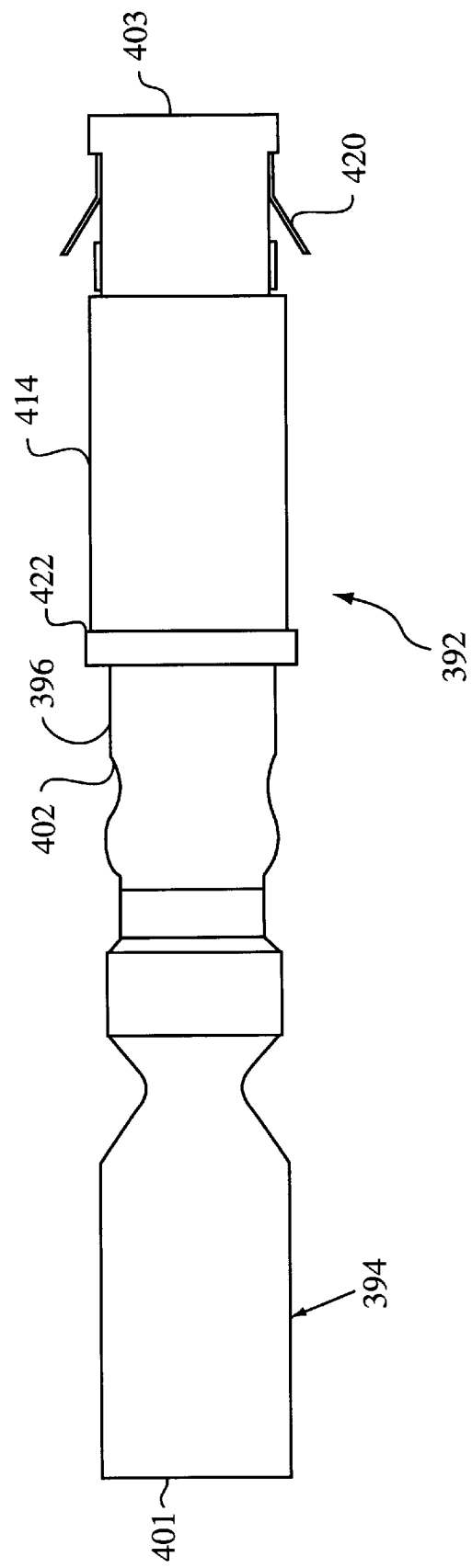
FIG. 30 is a view of a coaxial surface contact or mate according to another embodiment of the invention.
Figure 31:
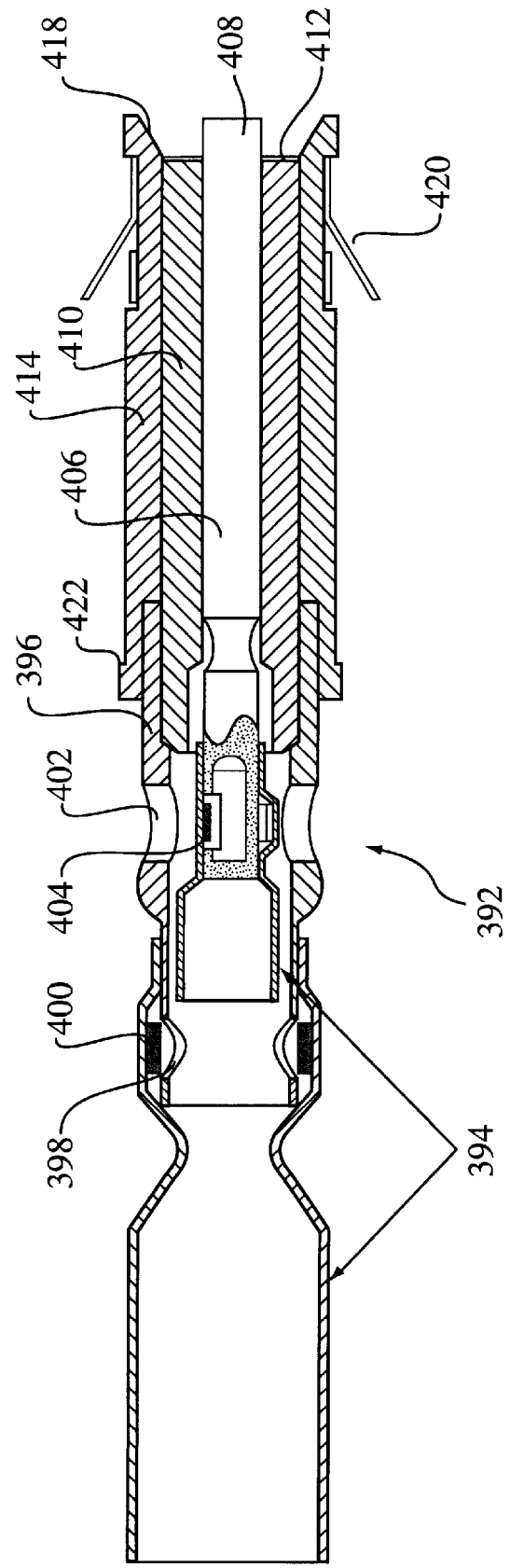
FIG. 31 is a partial cross sectional view of a coaxial surface contact according to another embodiment of the invention.

FIGS. 30–31 are views of a coaxial surface contact or mate according co another embodiment of the invention where the inner plungers or probes are not of the "twist" type described previously. In FIG. 30, coaxial surface contact 392 includes heat shrink tubing 394 with an internal band of solder disposed therein for receiving a coaxial cable via opening 401 and connecting thereto. Outer shield 396 having inspection hole 402 is connected to heat shrink tubing 394 via the solder band disposed in heat shrink tubing 394, as will be discussed in greater detail below. A second outer shield 414 is connected to the first outer shield 396 via conventional means such as crimping, soldering and the like.

A second outer shield 414 includes mechanical stop 422 which prevents the coaxial surface contact from being inserted too far into, for example, an interchangeable test adapter wiring module (see, for example, FIGS. 28–29 of U.S. patent application Ser. No. 08/344,575 filed Nov. 18, 1994, the specification of which is incorporated herein by reference).

Outer shield 414 also includes retaining rings 420 which are used to prevent coaxial surface contact 392 from being easily dislodged from, for example, the interchangeable test adapter wiring module, once coaxial surface contact 392 is inserted therein. Coaxial surface contact 392 includes opening 403 for mating with or providing electrical connection with at least one end of the coaxial spring probe assembly described above.

FIG. 31 is a partial sectional view of the coaxial surface contact. In FIG. 31, coaxial surface contact 392 includes two separate heat shrink tubings 394. The outer heat shrink tubing engages with the outer insulation/shield of the coaxial cable. The inner section of heat shrink tubing 394 engages the inner conductor of the coaxial cable. Outer shield 396 includes solder access hole 398 and inspection hole 402. Solder access hole 398 is used to permit the outer insulator/shield of the coaxial cable to be fixed to the outer heat shrink tubing 394 via solder connection 400 when solder connection 400 is heated. Inspection hole 402 is used to permit the inner heat shrink tubing 394 to be heated, thereby connecting inner conductor of the coaxial cable to the inner heat shrink tubing via solder connection 404.

Coaxial surface contact 392 also includes center conductor 406 terminating at protruding end 408. Center conductor 406 is to be in electrical connection with the center conductor of the coaxial cable via solder connection 404 in the inner heat shrink tubing 394. Coaxial surface contact 392 further includes insulator 410 which substantially surrounds center conductor 406. Insulator 410 terminates at outer end 412 which is disposed or configured to be slightly behind protruding end 408 of conductor 406, as will be explained in greater detail below. Insulator 410 of coaxial surface contact 392 is substantially surrounded by a combination of two outer shields, outer shield 396 and outer shield 414.

Outer shields 396 and 414 are affixed to each other via conventional means, such as crimping and/or soldering connections, and the like. The combination of outer shields 396 and 414 provides electrical connection between the outer shield of the coaxial cable and the outer shields of the coaxial spring probe assembly described in more detail below. Insulator 414 is affixed within coaxial surface contact 392 via the crimping action used to connect outer shields 396 and 414 together.

Outer shield 414 is shaped at its outer end 418 for receiving or mating with a conical shaped or tapered surface. Advantageously, this configuration of outer shield 414 greatly enhances the electrical contact between outer shield 414 and its mating surface. Outer shield 414 also includes retaining rings 420 and mechanical stops 422, as described in detail above.

Figure 32:
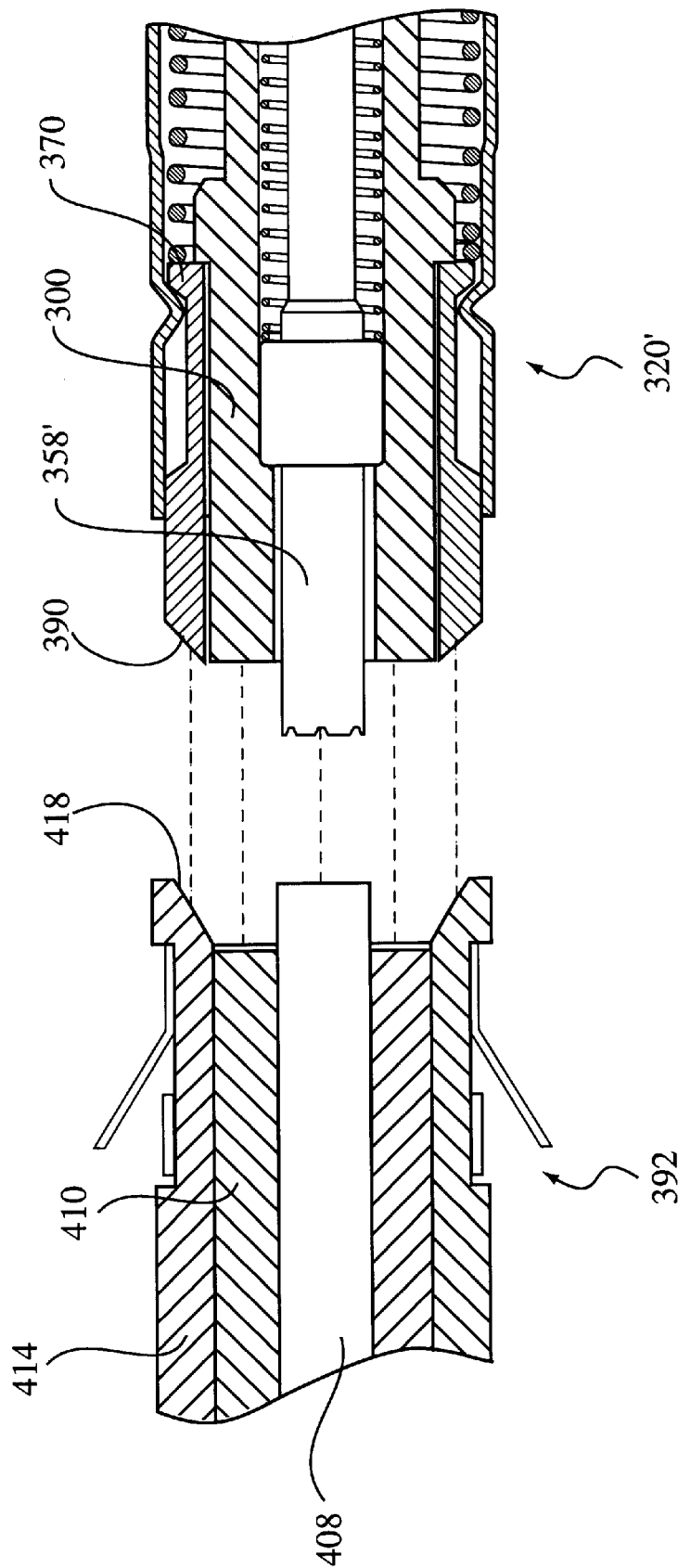
FIGS. 32–33 are partial cross sectional views illustrating the engagement between a coaxial surface contact and a coaxial double-headed twist probe according to another embodiment of the invention.

FIG. 32 is a partial cross-sectional view illustrating the engagement between a coaxial surface contact and a coaxial probe that does not require twist plungers according to another embodiment of the invention. As illustrated in FIG. 32, outer shield 370 of coaxial spring probe 320' engages outer shield 414 of coaxial surface contact 392 via mating of conical shaped surfaces 390 and 418.

Conical or angularly shaped surfaces 390 and 418 advantageously provide a secure connection between coaxial spring probes 320' and coaxial surface contact 392. Conical shaped surfaces 390 and 418 also prevent transverse movement between coaxial spring probe 320' and coaxial surface contact 392, thereby providing a more secure connection therebetween. When coaxial spring probe 320' engages with coaxial surface contact 392, insulator 300 also engages insulator 410 as spring probe 358' is depressed when engaged with center conductor 408.

Figure 33:
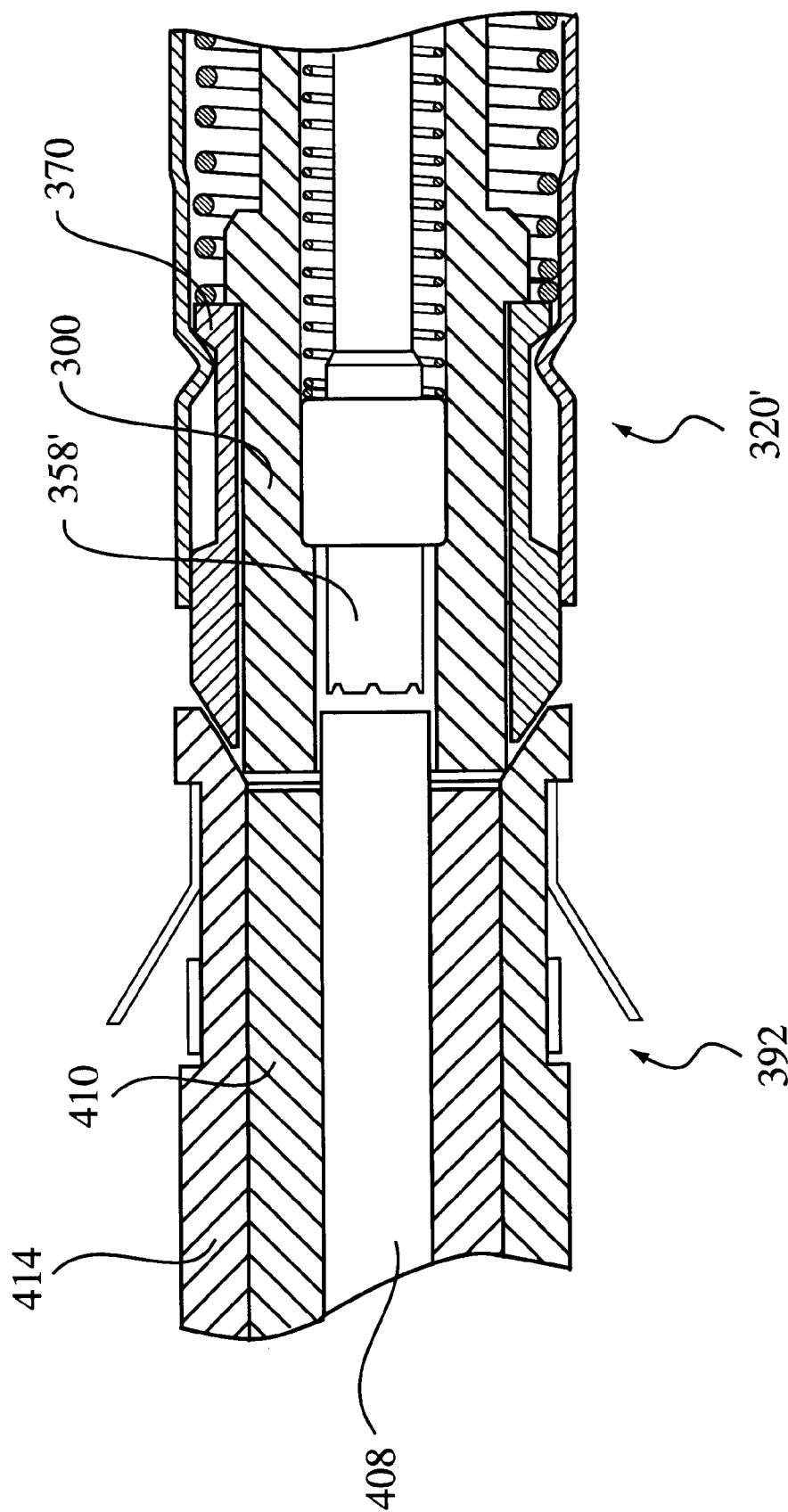

FIG. 33 is an illustration of the complete engagement between the coaxial spring probe assembly 320' and coaxial surface contact 392. As clearly illustrated in FIG. 33, coaxial spring probe assembly 320' is securely connected to coaxial surface contact 392, particularly with respect to transverse movements.

In summary, the double-headed twist probe and the coaxial double-headed twist probe according to the invention provides direct electrical conductivity between circuitry mounted on parallel substrates, avoiding intermediate connectors and wiring. By mounting a plurality of double-headed twist probes or a plurality of coaxial double-headed twist probes in a suitable supporting member, a double-sided "bed of nails" configuration is achieved to form a TAC module. The TAC module accommodates simplified removal and replacement of frequently changed circuit board mounted components, such as testing equipment personality boards.

In addition, the coaxial surface contact and the coaxial spring probe assembly provide a unique structure and process for coaxial connections. For example, one of the features of the double-headed coaxial spring probe assembly is that the internal plungers are outwardly biased against each other. Further, the outer shields of the double-headed coaxial spring probe assembly are also or alternatively outwardly biased against each other. The double-headed coaxial spring probe assembly advantageously outwardly biases the insulator cores using the outward bias of the inner plungers.

The insulators in the coaxial spring probe assembly are advantageously biased inwardly via compression of the outer shields when the outer shields engage with an external surface. Thus, the insulators and outer shields remain essentially in the same plane of contact. Further, both the coaxial spring probe assembly and the coaxial surface contact include outer shields with tapered ends (or conical-like shape), thereby providing more secured connection therebetween, particularly with respect to transverse movement. Significantly, the coaxial spring probe assembly includes components that are movably connected to one another, and does not necessarily require solder-like connection therein. Rather, internal components of the coaxial spring probe assembly are movably connected to one another.

While the double-headed coaxial spring probe assembly has been illustrated, it should also be noted that a single-headed coaxial assembly is also possible which includes many of the important aspects of the double-headed coaxial spring probe assembly. In addition, a coaxial double-headed spring probe assembly can be used with twist plungers or with plungers that are merely outwardly biased in any conventional manner.

Although the present invention has been described and illustrated in detail, it is clearly understood that the same is by way of illustration and example only and is not to be taken by way of limitation, the spirit and scope of the present invention being limited only by the terms of the appended claims.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. An electrical test probe assembly for loaded board testing, comprising:
   a housing having a hollow interior;
   first and second opposite shields positioned and axially slidable in said housing and outwardly biased against each other, said first and second opposite shields forming first and second shield cavities, respectively;
   first and second opposite insulators positioned and axially slidable in said first and second shield cavities, respectively, said first and second opposite insulators forming an insulator cavity extending along the housing; and
   first and second opposite plungers positioned and axially slidable in said insulator cavity of said first and second opposite insulators and outwardly biased against each other.

2. The electrical test probe assembly according to claim 1, wherein axial movement of said first insulator will cause axial movement of said first plunger.

3. The electrical test probe assembly according to claim 1, wherein axial movement of said first shield drives axial movement of said first insulator, and axial movement of said first insulator drives axial movement of said first plunger.

4. The electrical test probe assembly according to claim 1, wherein axial movement of said first insulator drives axial and rotational movement of said first plunger.

5. The electrical test probe assembly according to claim 1, wherein said first and second opposite insulators are inwardly biased by and secured within the housing by said first and second opposite shields, respectively.

6. The electrical test probe assembly according to claim 1, wherein said first and second opposite plungers respectively limit inner movement of said first and second opposite insulators in said housing, and said first and second opposite plungers outwardly bias said first and second opposite insulators.

7. The electrical test probe assembly according to claim 1, wherein said first and second opposite plungers and said first and second opposite shields are independently biased.

8. The electrical test probe assembly according to claim 1, wherein said first and second opposite plungers are biased by a first spring, and said first and second opposite shields are biased by a second spring.

9. The electrical test probe assembly according to claim 1, wherein one of said first and second insulators is inserted and axially slidable in another of said first and second insulators.

10. The electrical test probe assembly according to claim 1, wherein said first and second opposite plungers include outer portions extending through respective opposite open ends of the housing, each of said first and second opposite plungers terminating in a contact tip outside the housing, said first opposite plunger having a receptacle extending into the housing with a keyway in the receptacle, said second opposite plunger having a twisted guide member extending through the housing into the keyway of said first opposite plunger, and axial translation of said first and second plungers relative to each other causes each of said first and second opposite plungers to rotate.

11. The electrical test probe assembly of claim 10, wherein the contact tip of said first opposite plunger comprises inwardly directed leaves for engaging a contact probe head inserted therein.

12. The electrical test probe assembly according to claim 1, wherein said housing includes first and second opposite ends each having restricted apertures for limiting axial travel of said first and second opposite shields.

13. The electrical test probe assembly according to claim 1,
   wherein said first opposite plunger includes a receptacle extending into the housing with a keyway in the receptacle, and said second opposite plunger includes a twisted guide member extending through the housing into the keyway of said first opposite plunger, and
   wherein the twisted guide member of said second opposite plunger includes a bearing surface formed by a wall of a channel formed therein, and a spiral channel formed along a length of the twisted guide member.

14. The electrical test probe assembly according to claim 13, wherein said second opposite plunger further includes a cylindrical member having a first helical channel forming a bearing surface for engaging the keyway of said first opposite plunger.

15. The electrical test probe assembly according to claim 14, wherein said second opposite plunger further comprises a second helical channel formed opposite said first helical channel in said cylindrical member.

16. The electrical test probe assembly according to claim 15, wherein the keyway includes radially extending tabs engaging said first and second helical channels.

17. The electrical test probe assembly according to claim 13, wherein the keyway is geometrically shaped as a regular polygon.

18. The electrical test probe assembly according to claim 1, wherein said housing includes a collar portion for longitudinal retention of said housing in a mounting member.

19. The electrical test probe assembly according to claim 1, wherein said housing has necked down portions at opposite ends thereof to limit travel of said first and second opposite plungers.

20. The electrical test probe assembly according to claim 1, wherein said first opposite plunger further comprises an elongated leafspring formed adjacent to the keyway for engaging said second opposite plunger against lateral movement during rotational movement of said second opposite plunger.

21. An electrical test probe assembly for loaded board testing, comprising:

a housing having a hollow interior;

first and second opposite shields positioned and axially slidable in said housing and outwardly biased, said first and second opposite shields forming first and second shield cavities, respectively;

first and second opposite insulators positioned and axially slidable in said first and second shield cavities, respectively, said first and second opposite insulators forming an insulator cavity extending along the housing; and first and second opposite plungers positioned and axially slidable in said insulator cavity of said first and second opposite insulators and outwardly biased.

22. The electrical test probe assembly according to claim 21, wherein said first and second opposite insulators are biased inwardly by said first and second opposite shields, respectively.

23. The electrical test probe assembly according to claim 21, wherein said first and second opposite insulators are biased outwardly by said first and second opposite plungers, respectively.

24. The electrical test probe assembly according to claim 21, wherein said first and second opposite shields are biased outwardly by said first and second opposite insulators, respectively.

25. The electrical test probe assembly according to claim 21, wherein said first and second opposite plungers are biased inwardly by said first and second opposite insulators, respectively.

26. An electrical test probe assembly for loaded board testing, comprising:

a housing having a hollow interior;

first and second opposite shields positioned and axially slidable in said housing and outwardly biased against each other, said first and second opposite shields forming a shield cavity;

first and second opposite insulators positioned in said shield cavity, said first and second opposite insulators forming an insulator cavity extending along the housing; and first and second opposite plungers positioned and axially slidable in said insulator cavity of said first and second opposite insulators and outwardly biased.

27. An electrical test probe assembly for loaded board testing according to claim 26, wherein said first and second opposite insulators, said first and second opposite plungers and said first and second opposite shields are disposed in said housing and said housing comprises as a single integral piece.

28. An electrical test probe assembly for loaded board testing, comprising:

a housing having a hollow interior;

first and second opposite shields positioned and axially slidable in said housing and outwardly biased, said first and second opposite shields forming a shield cavity;

first and second opposite insulators positioned in said shield cavity, said first and second opposite insulators forming an insulator cavity extending along the housing; and first and second opposite plungers positioned and axially slidable in said insulator cavity of said first and second opposite insulators and outwardly biased against each other.

29. An electrical test probe assembly for loaded board testing according to claim 28, wherein said first and second opposite insulators, said first and second opposite plungers and said first and second opposite shields are disposed in said housing as a single integral piece and said housing comprises as a single integral piece.

30. An electrical test probe assembly for loaded board testing, comprising:

a housing having a hollow interior;

first and second opposite shields positioned and axially slidable in said housing and outwardly biased, said first and second opposite shields forming a shield cavity, said first and second opposite shields having respective first and second shield ends, and at least one of the first and second shield ends being tapered for engagement with an external surface having a corresponding taper;

first and second opposite insulators positioned in said shield cavity, said first and second opposite insulators forming an insulator cavity extending along the housing; and first and second opposite plungers positioned and axially slidable in said insulator cavity of said first and second opposite insulators and outwardly biased.

31. A method of providing electrical connection using a contact probe for loaded board testing, comprising the steps of:

(a) providing a housing for the double-headed spring contact probe;

(b) providing first and second shields forming a shield cavity to axially slide in the housing;

(c) outwardly biasing the first and second shields;

(d) providing first and second insulators to axially slide in the shield cavity of the first and second shields, the first and second insulators forming an insulator cavity extending through the housing;

(e) providing first and second plungers to axially slide relative to each other in the insulator cavity formed by the first and second insulators, and to transmit a signal through the contact probe; and (f) outwardly biasing the first and second plungers.

32. An electrical test probe assembly for loaded board testing, comprising:

a housing having a hollow interior;

first and second opposite shields positioned and axially slidable in said housing and outwardly biased, said first and second opposite shields forming first and second shield cavities, respectively;

first and second opposite insulators positioned and axially slidable in said first and second shield cavities, respectively, said first and second opposite insulators forming an insulator cavity extending along the housing; and first and second opposite plungers positioned and axially slidable in said insulator cavity of said first and second opposite insulators and outwardly biased.

33. An electrical test probe assembly for loaded board testing, comprising:

a housing having a hollow interior;

first and second opposite shields positioned in said housing and outwardly biased, said first and second opposite shields forming first and second shield cavities, respectively;

first and second opposite insulators positioned and axially slidable in said first and second shield cavities, respectively, said first and second opposite insulators forming an insulator cavity extending along the housing; and first and second opposite plungers positioned and axially slidable in said insulator cavity of said first and second opposite insulators and outwardly biased.

34. An electrical test probe assembly for loaded board testing according to claim 33, wherein said first and second opposite insulators are outwardly biased by said first and second opposite plungers and inwardly biased by said first and second opposite shields.

* * * * *